(12) United States Patent
Nishimura et al.

(10) Patent No.: US 7,508,172 B1
(45) Date of Patent: Mar. 24, 2009

(54) FAILURE DETECTION APPARATUS FOR AN ALTERNATOR

(75) Inventors: Shinji Nishimura, Tokyo (JP); Katsuyuki Sumimoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/041,982

(22) Filed: Mar. 4, 2008

(30) Foreign Application Priority Data

Nov. 7, 2007 (JP) ............................. 2007-289300

(51) Int. Cl.
*F02B 63/04* (2006.01)
(52) U.S. Cl. ........................... 322/37; 322/25; 322/11; 322/13; 290/40 A; 290/40 C; 290/40 R
(58) Field of Classification Search .................. 322/37, 322/11, 13, 25; 290/40 A, 40 C, 40 R
See application file for complete search history.

(56) References Cited

U.S. PATENT DOCUMENTS 7,345,457 B2 * 3/2008 Garces et al. ................. 322/59
7,368,893 B2 * 5/2008 Tsuzuki ........................ 322/28
7,394,166 B2 * 7/2008 Teichmann et al. ........... 290/44

FOREIGN PATENT DOCUMENTS

JP      08-065914 A     3/1996

* cited by examiner

*Primary Examiner*—Nicholas Ponomarenko
*Assistant Examiner*—Iraj A Mohandesi
(74) *Attorney, Agent, or Firm*—Sughrue Mion, PLLC

(57) ABSTRACT

A failure detection apparatus for an alternator can detect a short circuit failure of a diode in a full-wave rectifier with high precision by use of a simple circuit structure based on the state of a detection terminal when the alternator generates no electricity. The rectifier circuit has a pair of diodes connected to a positive terminal and a negative terminal, respectively, of a battery. A failure detection circuit has the detection terminal connected to a P terminal or a neutral point of an armature coil, and makes a failure determination in the following manner. When in the non-power generation state of the armature coil, the detection terminal is in a floating or high impedance state, the full-wave rectifier circuit is determined to be normal, whereas when otherwise, the full-wave rectifier circuit is determined to be in a failure.

14 Claims, 17 Drawing Sheets

FAILURE DETECTION APPARATUS FOR AN ALTERNATOR

BACKGROUND OF THE INVENTION

1. Field of the Invention

The present invention relates to a failure detection apparatus for an alternator (three-phase alternator), for example, mounted on a vehicle. In particular, it relates to a technique for diagnosing a short circuit failure of a rectifier diode group (hereinafter also referred to simply as "diodes") in a full-wave rectifier circuit in an alternator.

2. Description of the Related Art

A known failure detection apparatus for an alternator detects a voltage duty of a phase voltage detection terminal (hereinafter referred to as a "P terminal") during the generation of electricity, and when the voltage duty thus detected is in the vicinity of 50%, it is determined that the alternator is normal, whereas when the voltage duty deviates from 50%, it is determined that the alternator is abnormal (see, for example, a first patent document: Japanese patent application laid-open No. H8-65914).

In such a known failure detection apparatus for an alternator, it is necessary to provide voltage dividing resistors of high precision as a voltage detection means for the purpose of accurately detecting whether the voltage duty is in the vicinity of 50%, so there has been a problem that circuitry including such high precision resistors becomes expensive.

In addition, the detection accuracy of the known failure detection apparatus at low electrical load is poor, and hence it is also necessary to provide a cancellation circuit for inhibiting voltage detection at low electrical load, so there has also been a problem that the circuitry becomes more complicated and expensive.

SUMMARY OF THE INVENTION

The present invention is intended to obviate the problems as referred to above, and has for its object to obtain a failure detection apparatus for an alternator which is capable of making a failure diagnosis on an abnormality (short circuit failure) of a diode in a full-wave rectifier circuit in the alternator with a high degree of precision by use of a simple circuit structure.

Bearing the above object in mind, a failure detection apparatus for an alternator according to the present invention includes: an armature coil; a full-wave rectifier circuit that is connected to the armature coil and has a positive side diode with its positive terminal electrically connected to a positive terminal of a battery, and a negative side diode with its negative terminal electrically connected to a ground terminal of the battery; and a failure detection circuit with its detection terminal connected to a P terminal or a neutral point of the armature coil. When in a non-power generation state of the armature coil, the detection terminal is in a floating state or a high impedance state in which a voltage at the detection terminal is indefinite, the failure detection circuit determines that the full-wave rectifier circuit is normal, and when in the non-power generation state of the armature coil, the detection terminal is not in a floating state nor a high impedance state, the failure detection circuit determines that the full-wave rectifier circuit is in a failure.

According to the present invention, by performing a failure diagnosis based on the state of the detection terminal at the time when the alternator generates no electricity, it is possible to detect the short circuit failure of the diode in the full-wave rectifier in the alternator with a high degree of precision by use of a simple circuit structure.

The above and other objects, features and advantages of the present invention will become more readily apparent to those skilled in the art from the following detailed description of preferred embodiments of the present invention taken in conjunction with the accompanying drawings.

DESCRIPTION OF THE PREFERRED EMBODIMENTS

Now, preferred embodiments of the present invention will be described below in detail while referring to the accompanying drawings.

Embodiment 1

Figure 1:
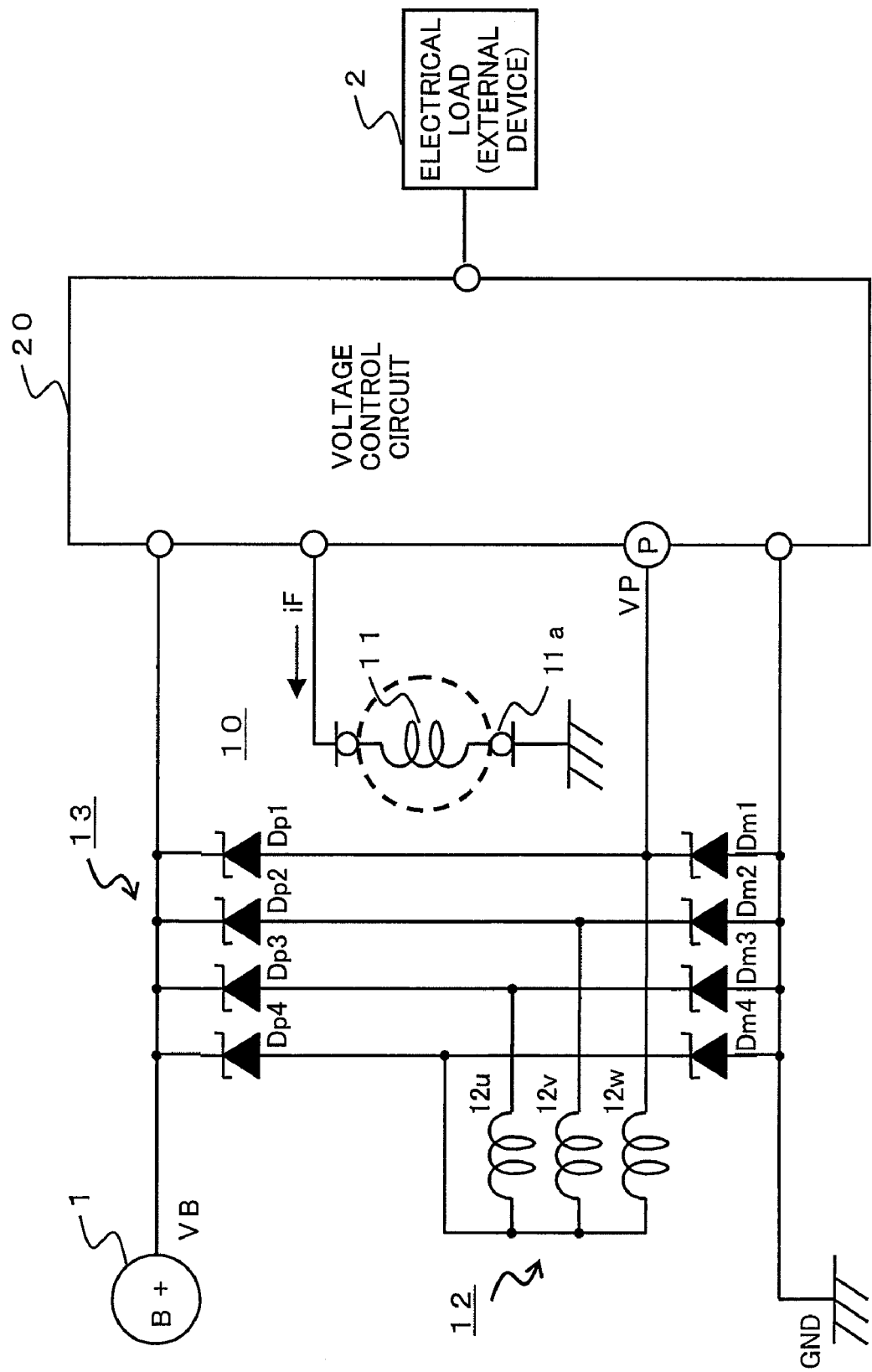
FIG. 1 is a block diagram schematically showing a failure detection apparatus for an alternator according to a first embodiment of the present invention.

Referring to the drawings and first to FIG. 1, there is schematically shown, in a block diagram, a failure detection apparatus for an alternator according to a first embodiment of the present invention, including a power generation system and its peripheral equipment.

In FIG. 1, an on-board battery 1, which is adapted to be installed on a vehicle, generates a battery voltage VB from its positive terminal.

An alternator (alternator) 10 connected to the battery 1 includes a field coil 11 that is mounted on a rotor through a brush 11a, a three-phase armature coil 12 that is mounted on a stator in a manner to be in opposition to the field coil 11, and a full-wave rectifier circuit 13 that is electrically connected to the armature coil 12.

The full-wave rectifier circuit 13 has plus (positive) side diodes Dp (Dp1 through Dp4) and minus (negative) side diodes Dm (Dm1 through Dm4). Each of the positive side diodes Dp has a plus (positive) terminal electrically connected to the positive terminal of the battery 1, and each of the negative side diodes Dm has a minus (negative) terminal electrically connected to a ground terminal GND (vehicle earth) of the battery 1.

Each of the positive side diodes Dp and the negative side diodes Dm is composed of a Zener diode, for example. Here, note that a positive side diode Dp4 and a negative side diode Dm4, which are electrically connected to a neutral point, can be omitted.

The three-phase armature coil 12 comprising three coil elements (12u, 12v, 12w) has individual one terminals (P terminals) of the coil elements connected to junctions of positive side diodes Dp (Dp1 through Dp3) and negative side diodes Dm (Dm1 through Dm3), respectively. The armature coil 12 has individual neutral points connected to a junction of a positive side diode Dp4 and a negative side diode Dm4.

The armature coil 12 has at least one P terminal which is connected to a failure detection circuit (to be described later) in a voltage control circuit 20, and which functions as a detection terminal for the failure diagnosis of the full-wave rectifier circuit 13.

Here, note that the at least one P terminal of the armature coil 12 is used as a detection terminal, but a neutral point of the armature coil 12 may be used as a detection terminal. This is because a failure diagnosis is performed based on the state of the detection terminal at the time of non-generation of electricity, as will be described later, so the armature coil 12 is assumed to be resistors of low impedance, and if the full-wave rectifier circuit 13 is normal, at least one of the P terminals or any of the terminals at the neutral points becomes an equal state of floating or an equal state of high impedance.

The battery 1 and an external device in the form of an electrical load 2 for the alternator 10 are connected to the voltage control circuit 20.

In the course of the power generation operation of the alternator 10, a field current iF flowing through the field coil 11 is controlled by the voltage control circuit 20.

Figure 2:
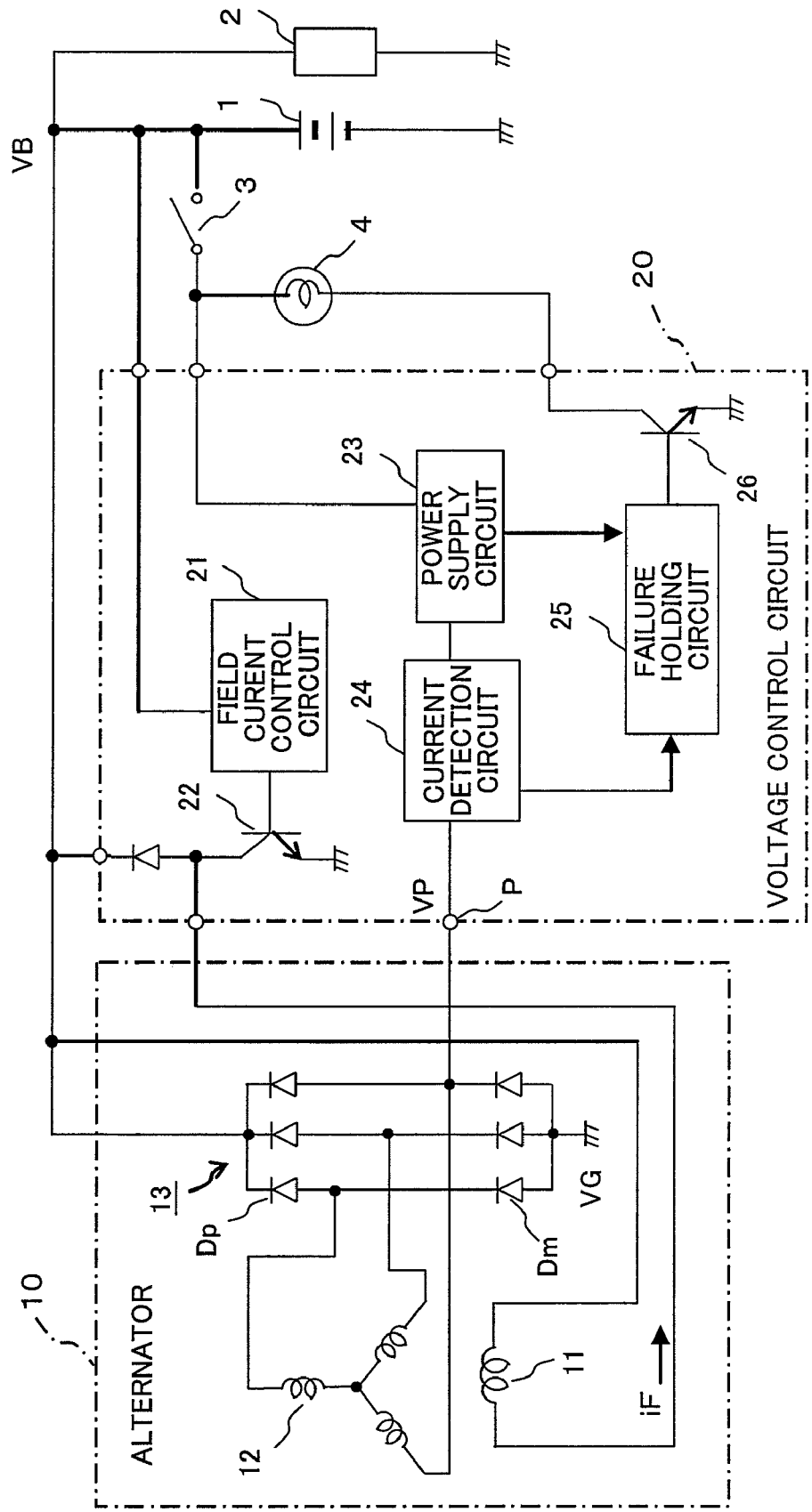
FIG. 2 is a functional block diagram of the failure detection apparatus for an alternator according to the first embodiment of the present invention.

FIG. 2 is a functional block diagram of the failure detection apparatus for an alternator according to the first embodiment of the present invention, wherein the configuration of the interior of the voltage control circuit 20 and a part of its peripherals is specifically shown. Here, there is illustrated a case where any diode is not connected to the neutral points of the armature coil 12.

In FIG. 2, the voltage control circuit 20 includes a field current control circuit 21 that turns on and off a transistor 22 thereby to control the field current iF, a power supply circuit 23 and a current detection circuit 24 that serve to detect the state of a P terminal (which is a detection terminal and hereinafter referred to as the P terminal), a failure holding circuit 25 that determines the presence or absence of a failure and holds the result of the determination, and an alarm driving transistor 26 with a grounded emitter.

Although here (also in the following preferred embodiments), an explanation will be made by taking as an example a case where the failure detection circuit is formed in the voltage control circuit 20, such a failure detection circuit can be provided separately from the voltage control circuit 20.

The alarm driving transistor 26 has a base connected to an output terminal of the failure holding circuit 25, and a collector connected to the alarm lamp 4 (a warning unit).

The power supply circuit 23 and the current detection circuit 24 (power supply unit) are connected to the P terminal (detection terminal), and constitute the failure detection circuit, together with the failure holding circuit 25, the alarm driving transistor 26 and the alarm lamp 4.

The power supply circuit 23 and the alarm lamp 4 are connected to the positive terminal of the battery 1 so as to be impressed with the battery voltage VB when the key switch 3 is turned on (closed).

The power supply circuit 23 functions as a non-power generation detection circuit that detects the non-power generation state of the armature coil 12. That is, the power supply circuit 23 assumes a fixed period of time after turning on of the key switch 3 to be a non-power generation state, and outputs a condition signal for non-generation of electricity (to be described later), thereby making effective the failure detection circuit including the current detection circuit 24 and the failure holding circuit 25.

If in the non-power generation state of the armature coil 12, the P terminal (detection terminal) is in a floating state or a high impedance state in which a voltage VP at the P terminal (hereinafter referred to as a P terminal voltage) is indefinite, and if the current detection circuit 24 detects no current, the failure detection circuit determines that the positive side diodes Dp and the negative side diodes Dm of the full-wave rectifier circuit 13 are normal.

On the other hand, if in the non-power generation state of the armature coil 12, the P terminal (detection terminal) is not in a floating state nor a high impedance state, and if the current detection circuit 24 detects a current, the failure detection circuit determines that either the positive side diodes Dp and the negative side diodes Dm of the full-wave rectifier circuit 13 is in a short circuit failure.

Further, the alarm lamp 4 is provided with the alarm lamp 4, and when it is determined that the full-wave rectifier circuit 13 is in a failure, the failure detection circuit informs a vehicle driver of the state of the occurrence of a failure by driving the alarm lamp 4.

Next, reference will be made to the operation of this first embodiment of the present invention, as shown in FIGS. 1 and 2.

First of all, when the key switch 3 is turned on by the driver, the battery voltage VB is supplied to the power supply circuit 23 that constitutes the failure detection circuit in the current control circuit 20.

At this time, within a fixed period of time before the generation of electricity (engine driving), the power supply circuit 23 outputs a predetermined voltage so that the P terminal voltage VP becomes the predetermined voltage (i.e., between the battery voltage VB (inclusive) and a ground voltage VG (inclusive)).

Here, in case where the diodes of the full-wave rectifier circuit 13 in the alternator 10 are normal, the P terminal becomes a floating state or a high impedance state in which the P terminal voltage VP is indefinite, and current does not flow to the P terminal, so the current detection circuit 24 outputs a detected current value of "0".

Accordingly, in this case, the failure holding circuit 25 determines that the full-wave rectifier circuit 13 is normal, so the alarm driving transistor 26 is not driven to turn on, and hence the alarm lamp 4 is not driven to illuminate.

Thus, after the normal state of the full-wave rectifier circuit 13 is detected, the failure holding circuit 25 stores the normal state, so the alternator 10 is shifted to a power generation mode in which the alternator 10 is driven to rotate in accordance with ordinary engine driving without the alarm lamp 4 being driven to light.

On the other hand, in case where the current detection circuit 24 detects a current at the time when the predetermined voltage is output from the power supply circuit 23 within the fixed period of time after the key switch 3 is turned on (in the non-power generation state), the failure holding circuit 25 determines that the positive side diodes Dp and the negative side diodes Dm of the full-wave rectifier circuit 13 are in a short circuit failure, and drives the alarm lamp 4 to light.

For example, when one of the positive side diodes Dp comes to a short circuit failure, a corresponding P terminal of the armature coil 12 is short circuited to a corresponding positive terminal of the full-wave rectifier circuit 13 (the positive terminal of the battery 1), and the P terminal voltage VP rises to the battery voltage VB, so a current flows from the P terminal toward the power supply circuit 23 even if the power supply circuit 23 is about to output the predetermined voltage.

Accordingly, since the current detection circuit 24 outputs a detected current value, the failure holding circuit 25 determines that the positive side diodes Dp are in a short circuit failure, and stores and holds the result of the determination (failure state), while turning on the alarm driving transistor 26 to drive the alarm lamp 4 to light.

In addition, when one of the negative side diodes Dm comes to a short circuit failure, a corresponding P terminal of the armature coil 12 is grounded to a corresponding negative terminal of the full-wave rectifier circuit 13 (ground terminal GND), so a current flows out from the power supply circuit 23 to the ground terminal GND even if the power supply circuit 23 is about to set the P terminal voltage VP to the predetermined voltage.

Accordingly, since the current detection circuit 24 outputs a detected current value, the failure holding circuit 25 determines that the negative side diodes Dm are in a short circuit failure, and stores and holds the result of the determination (failure state), while turning on the alarm driving transistor 26 to drive the alarm lamp 4 to light.

Here, note that a P terminal for one phase of the armature coil 12 is connected to the detection terminal of the failure detection circuit, but diodes of other phases than the diode directly connected to the P terminal are respectively connected to the P terminal (detection terminal) through the armature coil 12 of small impedance, so when a diode of another phase comes to a short circuit failure, too, it is possible to detect the failure in a similar manner.

Although in the foregoing description, the fixed period of time after the key switch 3 is turned on is assumed to be a non-power generation state, the failure detection circuit is able to perform failure detection if the alternator 10 is in a non-power generation state, and hence by cooperating the failure detection circuit with the field current control circuit 21, a failure diagnosis can be performed even during the power generation operation of the alternator 10 while interrupting the field current iF thereby to place the alternator 10 into a non-power generation state.

In addition, although there is shown a case where the armature coil 12 uses the three-phase alternator 10 with their windings or wires connected in a star-like manner, it is needless to say that similar operational effects can be achieved with a similar failure detection circuit even if the armature coil 12 uses the alternator 10 of a three-phase delta connection.

Further, the alarm lamp 4 is used as a warning unit, but other indicating or displaying units, sound warning units, etc., may instead be used.

As described above, the failure detection apparatus for an alternator (FIG. 1 and FIG. 2) according to the first embodiment of the present invention includes: the full-wave rectifier circuit 13 that is connected to the armature coil 12, and has the positive side diodes Dp with their positive terminals electrically connected to the positive terminal of the battery 1, and the negative side diodes Dm with their negative terminals electrically connected to the ground terminal GND of the battery 1; and the failure detection circuit that has the detection terminal connected to one of the P terminals or the neutral point of the armature coil 12.

If in the non-power generation state of the armature coil 12, the detection terminal is in a floating state or a high impedance state in which the voltage at the detection terminal is indefinite, the failure detection circuit determines that the full-wave rectifier circuit 13 is normal, whereas if in the non-power generation state of the armature coil 12, the detection terminal is not in a floating state nor in a high impedance state, the failure detection circuit determines that the full-wave rectifier circuit 13 is in a failure.

In addition, the failure detection circuit includes the power supply circuit 23 and the current detection circuit 24 (power supply unit) that are connected to the detection terminal, and the failure holding circuit 25 that is connected to the power supply circuit 23 and the current detection circuit 24 and determines the presence or absence of a failure and holds the determination result.

As a result, based on a simple determination as to whether a current flows or does not flow to the P terminal, it is possible to diagnose the failure of the full-wave rectifier circuit 13 with a high degree of precision by use of a simple construction.

Moreover, the failure detection circuit is provided with the alarm lamp 4, and when it is determined that the full-wave rectifier circuit 13 is in a failure, the alarm lamp 4 is driven to light, as a consequence of which it is possible to inform the driver of the state of occurrence of the failure in a reliable manner, so that the driver is prompted to take appropriate countermeasures such as repair or the like.

Embodiment 2

Figure 3:
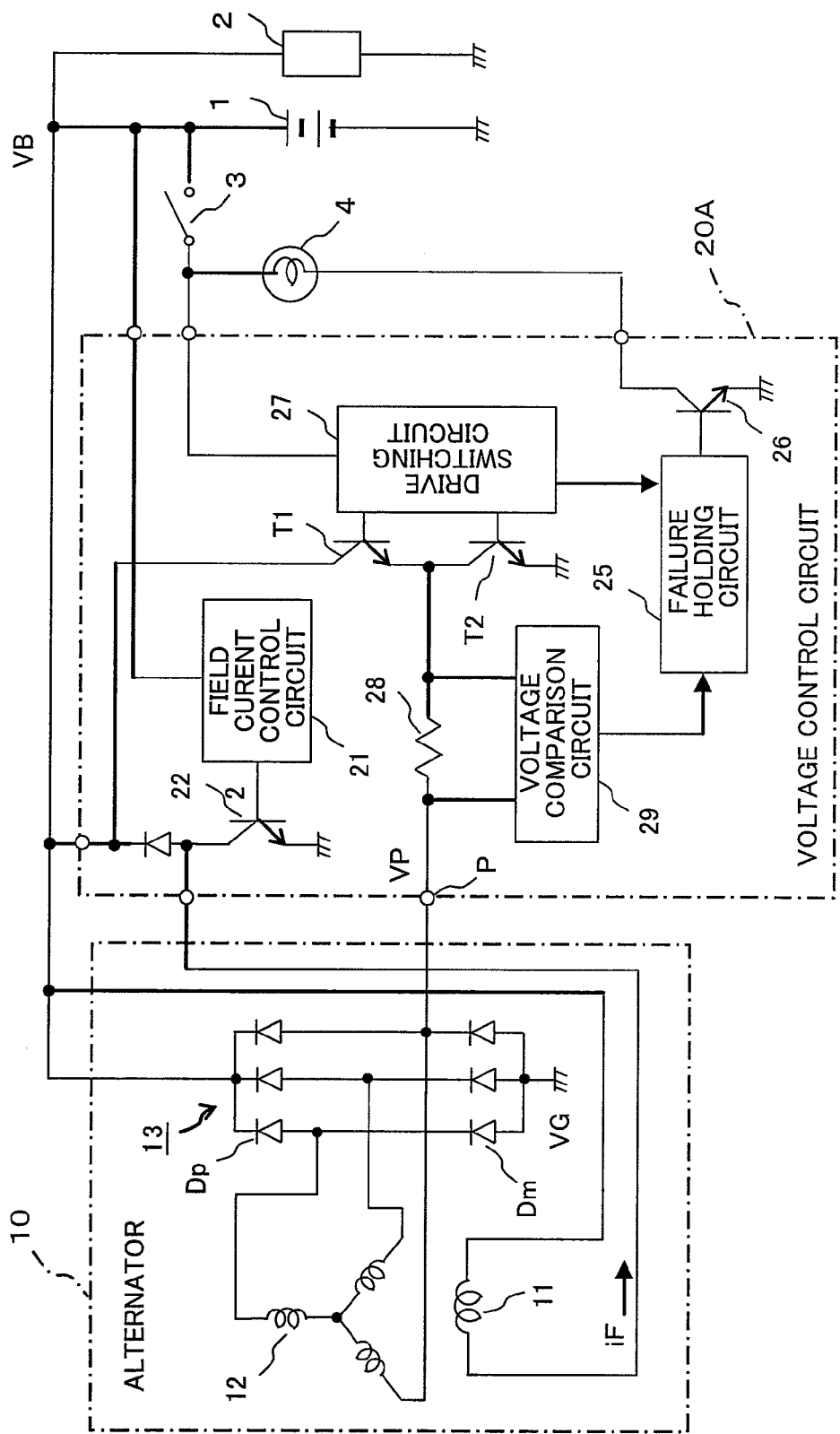
FIG. 3 is a functional block diagram showing a failure detection apparatus for an alternator according to a second embodiment of the present invention.

Although in the above-mentioned first embodiment (FIG. 2), the power supply circuit 23 is provided in the failure detection circuit for outputting the predetermined voltage (battery voltage VB≧predetermined voltage≧ground voltage VG), provision may be made for a drive switching circuit 27 that turns on transistors T1, T2 in a complementary manner to output the battery voltage VB or the ground voltage VG as the predetermined voltage by switching between them, as shown in FIG. 3.

FIG. 3 is a functional block diagram that shows a failure detection apparatus for an alternator according to a second embodiment of the present invention, wherein the same parts or elements as those described above (see FIG. 2) are identified by the same symbols or by the same symbols with "A" affixed to their ends, while omitting a detailed explanation thereof.

In FIG. 3, a failure detection circuit in a voltage control circuit 20A is provided, in place of the above-mentioned power supply circuit 23, with the drive switching circuit 27 that is inserted between a key switch 3 and a failure holding circuit 25, and the transistors T1, T2 with their emitters grounded that are driven to turn on in a complementary manner by means of the drive switching circuit 27.

In addition, the failure detection circuit is provided, in place of the above-mentioned current detection circuit 24, with a current limiting resistor 28 that is inserted between a junction of the transistor T1, T2 and the P terminal, and a voltage comparison circuit 29 that makes a comparison between respective voltages at opposite ends of the current limiting resistor 28.

In this case, too, the drive switching circuit 27 functions as a non-power generation detection circuit that detects the non-power generation state of armature coil 12, and assumes a fixed period of time after turning on of the key switch 3 to be a non-power generation state, thus making effective the failure detection circuit including the voltage comparison circuit 29 and the failure holding circuit 25.

The transistors T1, T2 have their individual bases connected to the drive switching circuit 27. The plus or positive side transistor T1 has a collector connected to the positive terminal of the battery 1, and an emitter connected to a collector of the minus or negative side transistor T2.

Here, note that the collector of the transistor T1 is not connected to an input terminal of a field current control circuit 21 (the positive terminal of the battery 1), but is connected to a cathode of a backflow prevention diode (the positive terminal of the battery 1) that is connected to a collector of a transistor 22 for controlling a field current. This is because the input terminal of the field current control circuit 21 functions as a detection terminal for the battery voltage VB, and so it is not to provide an influence on the control of the field current iF as much as possible.

Hereinafter, reference will be made to the operation of the second embodiment of the present invention, as shown in FIG. 3.

First of all, when the key switch 3 is turned on by the driver, the drive switching circuit 27 turns on the positive side transistor T1 for the fixed period of time (in the non-power generation state) before the start of generation of electricity. At this time, if the negative side diodes Dm of the full-wave rectifier circuit 13 are normal, the P terminal voltage VP becomes the same value as the battery voltage VB.

Subsequently, the drive switching circuit 27 turns off the positive side transistor T1, and turns on the negative side transistor T2. At this time, if the positive side diodes Dp of the full-wave rectifier circuit 13 are normal, the P terminal voltage VP becomes the same value as the ground voltage VG.

Thus, it is possible to diagnose whether all the diodes of the full-wave rectifier circuit 13 are normal (or faulty) by turning on the transistors T1, T2 in a complementary manner. That is, if they are normal, no current flows to the current limiting resistor 28 when either of the transistors T1, T2 is turned on, so the voltage comparison result of the comparison circuit 29 will show a voltage difference of "0" (a normal state).

Thus, after the normal state of the full-wave rectifier circuit 13 is detected, the failure holding circuit 25 holds the normal state, so the alarm lamp 4 is not driven to light, and the alternator 10 is shifted to an ordinary electric power generation mode.

On the other hand, when the positive side transistor T1 is turned on, the P terminal voltage VP becomes the ground voltage VG in case where any of the negative side diodes Dm of the full-wave rectifier circuit 13 is in a short circuit failure, so a current flows from the transistor T1 to the ground terminal GND through the current limiting resistor 28 and the faulty negative side diode Dm (being in the short circuit failure).

At this time, a voltage difference is generated between the opposite ends of the current limiting resistor 28 according to Ohm's law, so the voltage comparison circuit 29 outputs the voltage difference between the opposite ends of the current limiting resistor 28 as a comparison result.

Accordingly, the failure holding circuit 25 determines, based on the current flowing through the current limiting resistor 28, that the negative side diodes Dm are in a short circuit failure, and can hold the determination result (the state of occurrence of a failure).

Here, note that the voltage comparison circuit 29 is used herein, but a voltage detection circuit, which detects the P terminal voltage VP, may be used in place of the voltage comparison circuit 29. That is, it is found that when the transistor T1 is turned on, a voltage at one end of the current detection resistor 28 at the side of the transistor T1 becomes equal to the battery voltage VB, so even if it is determined that the P terminal voltage VP becomes not equal to the battery voltage VB (or becomes equal to the ground voltage VG), the short circuit failure of the negative side diodes Dm can be detected.

Similarly, when the negative side transistor T2 is turned on, the P terminal voltage VP becomes equal to the battery voltage VB in case where any of the positive side diodes Dp of the full-wave rectifier circuit 13 is in a short circuit failure, so a current flows from the faulty positive side diode Dm (being in the short circuit failure) to the ground terminal GND through the current limiting resistor 28 and the transistor T2. Accordingly, the occurrence of the short circuit failure of the positive side diodes Dp can be detected from the comparison result of the voltage comparison circuit 29 (voltage difference) upon turning on of the transistor T2.

Thus, when the short circuit failure of any of the diodes of the full-wave rectifier circuit 13 is determined, the failure holding circuit 25 stores the short circuit failure state of the diodes, and turns on the alarm lamp 4, as stated above.

Here, note that the above description has been made by taking as an example the case where the positive side transistor T1 is first turned on, but on the contrary, the negative side transistor T2 may instead be first turned on.

As described above, according to the second embodiment of the present invention (FIG. 3), the drive switching circuit 27, which serves to turn on the transistors T1, T2 in a complementary manner, and the current limiting resistor 28 are provided as a power supply unit, and the state of the P terminal (detection terminal) is determined based on the comparison result of the voltage comparison circuit 29 at the time when the predetermined voltage is set to the battery voltage VB or the ground voltage VG.

As a result, similar to the above-mentioned first embodiment, by using the electrical property of the P terminal (detection terminal) of one phase among a plurality of phases of the armature coil 12, it is possible to diagnose whether all the diodes of the full-wave rectifier circuit 13 are in a normal state, while achieving similar operational effects as described above.

Embodiment 3

Figure 4:
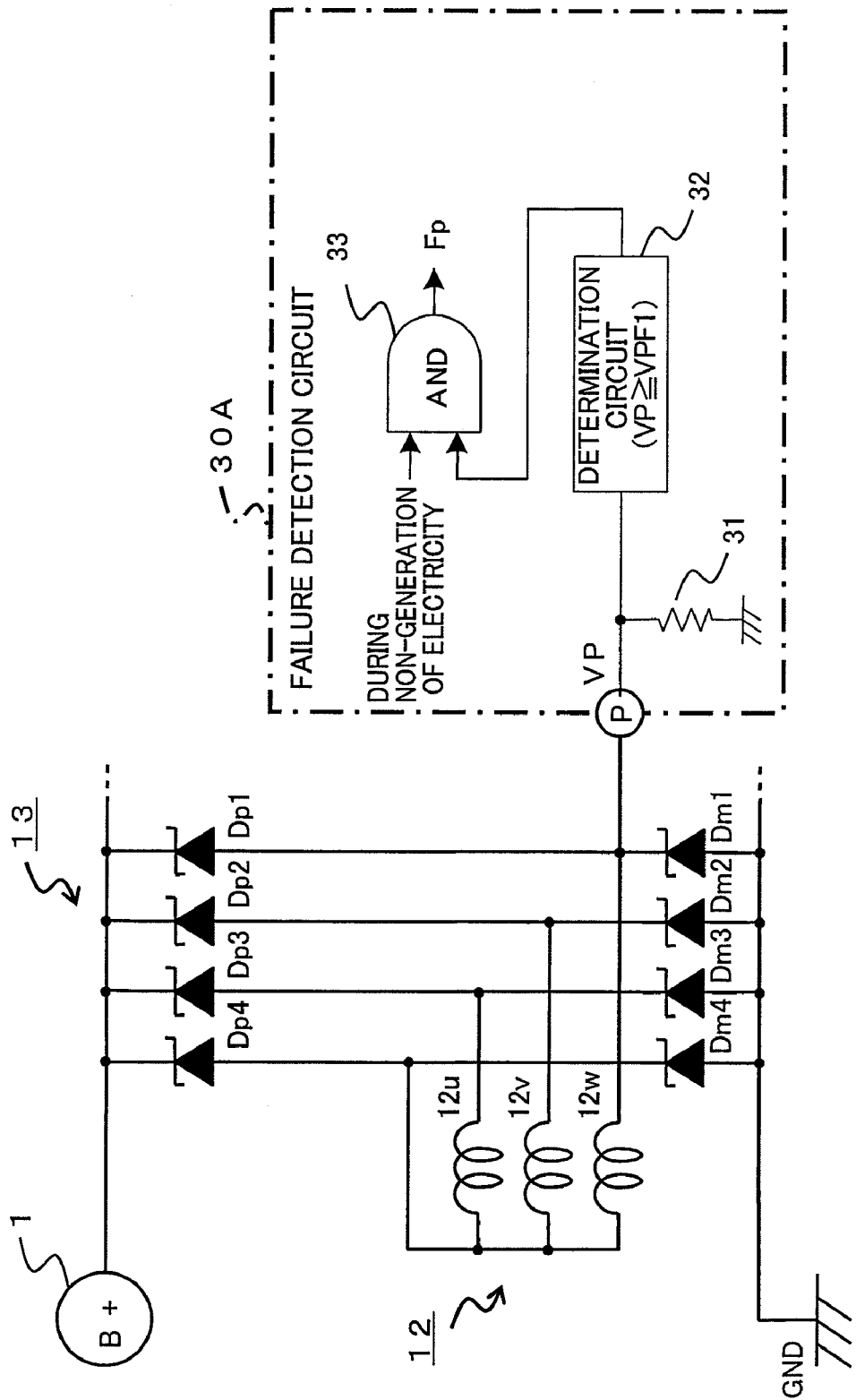
FIG. 4 is a functional block diagram showing a first configuration example of a failure detection apparatus for an alternator according to a third embodiment of the present invention.

Although no reference is made to a specific determination function of the failure detection circuit (including the power supply unit and the failure holding circuit 25) in the above-mentioned first and second embodiments (FIG. 2 and FIG. 3), the power supply unit and the failure determination unit (the failure holding circuit 25) of the failure detection circuit may be constructed in a manner as shown in FIG. 4.

FIG. 4 is a functional block diagram that shows a failure detection circuit 30A according to a third embodiment of the present invention, wherein the functional configuration of a power supply unit and a failure determination unit (failure holding circuit 25) in the case of intending to perform failure detection of positive side diodes Dp of a full-wave rectifier circuit 13 is schematically illustrated. In FIG. 4, the same or like parts or elements as those described above (see FIGS. 1 through FIG. 3) are identified by the same symbols while omitting a detailed description thereof.

The failure detection circuit 30A includes a first resistor 31 (hereinafter simply referred to as a "resistor") that is inserted between a P terminal (detection terminal) and a ground terminal GND, a determination circuit 32 that determines whether a P terminal voltage VP is equal to or higher than a first predetermined value VPF1 (short circuit failure of a positive side diode for Dp), and an AND gate 33 that calculates the logical product of a determination result of the determination circuit 32 and a determination result of non-generation of electricity (hereinafter referred to as a non-power generation determination result) and outputs a failure determination signal Fp for the positive side diodes Dp.

In this case, the resistor 31 corresponds to a power supply section, and the determination circuit 32 and the AND gate 33 correspond to the above-mentioned failure holding circuit 25. Here, note that the first predetermined value VPF1 is set to a voltage that is higher than the ground voltage VG (=0).

Here, when any of the positive side diodes Dp of the full-wave rectifier circuit 13 is in a short circuit failure, an impedance (resistance value) between the P terminal of the failure detection circuit 30A (voltage control circuit) and the battery 1 becomes lower, as compared with the case where the full-wave rectifier circuit 13 is normal, because even if any diode Dp is in a short circuit failure, the full-wave rectifier circuit 13 is short circuited through the armature coil 12.

Accordingly, the failure detection circuit 30A can detect the short circuit failure of the positive side diodes Dp by using the electrical property of the full-wave rectifier circuit 13, as seen from the P terminal.

For example, as shown in FIG. 4, in case where the resistor 31 (intentional GND-directed impedance circuit for the P terminal) is provided as a power supply unit for the failure detection circuit 30A, the P terminal voltage VP at the time of non-generation of electricity becomes as close to the ground voltage VG (=0) as possible if the positive side diodes Dp of the full-wave rectifier circuit 13 are all normal.

On the other hand, when any of the positive side diodes Dp is in a short circuit failure, the P terminal voltage VP rises. That is, when a positive side diode Dp1 of a u phase is in a short circuit failure, the P terminal voltage VP rises. Similarly, when a positive side diode Dp2 of a v phase is in a short circuit failure, the P terminal voltage VP rises through armature coil elements 12v, 12w, and when a positive side diode Dp3 of a w phase is in a short circuit failure, the P terminal voltage VP rises through armature coil elements 12u, 12w.

In addition, in case where the diodes are connected to neutral points, respectively, as shown in FIG. 4, the P terminal voltage VP rises through the armature coil 12w when a positive side diode Dp4 is in a short circuit failure.

Accordingly, the determination circuit 32 makes a determination as to whether the P terminal voltage VP at the time of non-generation of electricity is equal to or higher than the first predetermined value VPF1, and when it is shown that the value of the P terminal voltage VP is equal to or larger than the first predetermined value VPF1 (i.e., VP≧VPF1), the determination circuit 32 outputs a determination result indicating the short circuit failure of the positive side diodes Dp.

The AND gate 33 outputs the logical product of the non-power generation condition and the determination result of the determination circuit 32 as a failure determination signal Fp indication the failure of the positive side diodes Dp.

Hereinafter, as stated above (FIG. 2 and FIG. 3), the alarm driving transistor 26 is turned on in response to the failure determination signal Fp, whereby the alarm lamp 4 is driven to light.

Here, note that in case where the alternator 10 is a vehicular generator, there is a possibility that the P terminal voltage VP might be raised due to salt water leakage even if the positive side diodes Dp are normal, so the resistance value of the resistor 31 and the first predetermined value VPF1 for failure determination are set to appropriate voltage values that are higher than the ground voltage VG so as not to misjudge the salt water leakage as the failure of the full-wave rectifier circuit diodes Dp.

Figure 5:
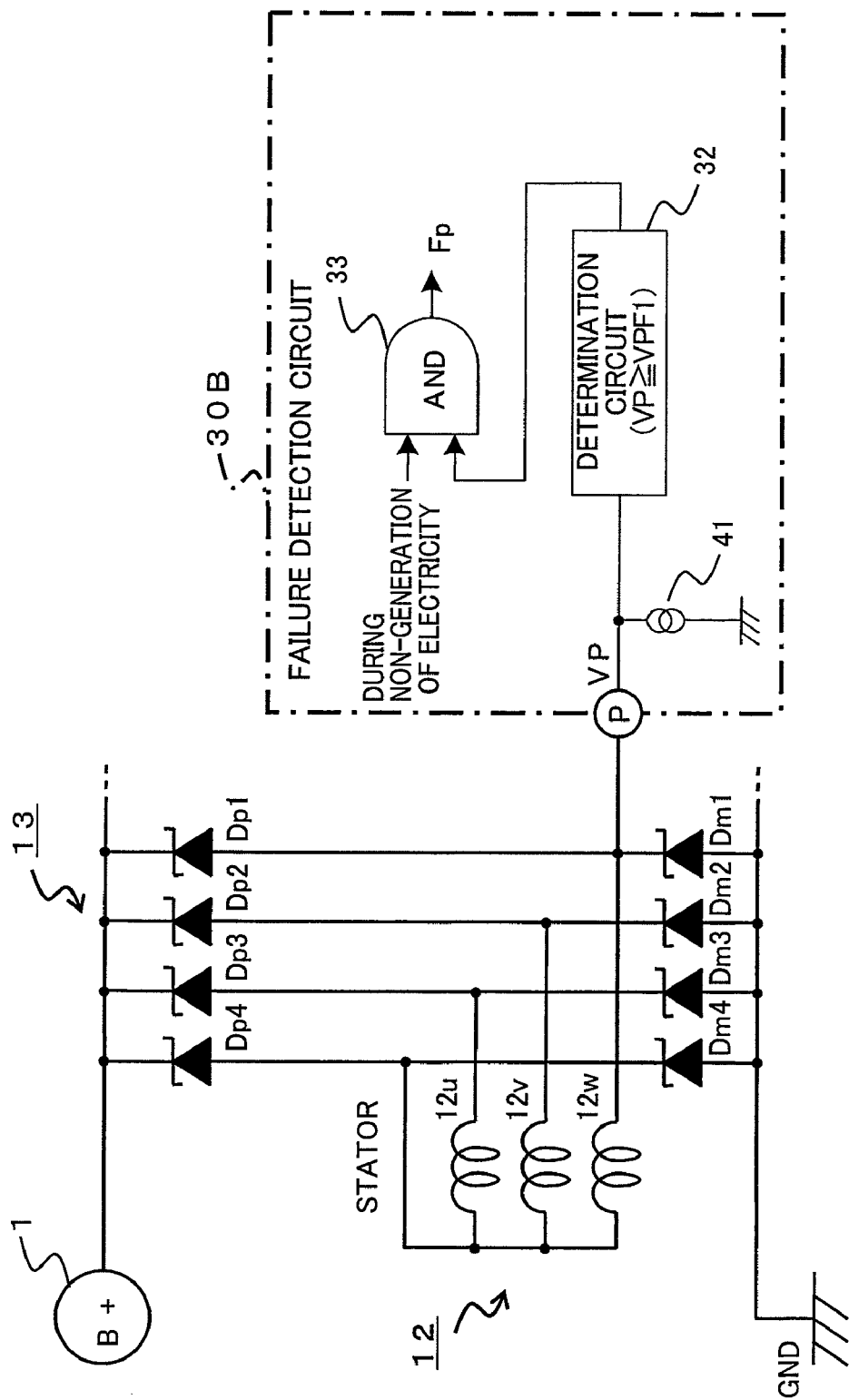
FIG. 5 is a functional block diagram showing a second configuration example of the failure detection apparatus for an alternator according to the third embodiment of the present invention.

Moreover, although in FIG. 4, the resistor 31 is used as the power supply unit, a first constant current source 41 (hereinafter simply referred to as a "constant current source") may instead be provided, as shown in FIG. 5.

In this case, too, the constant current source 41 operates in a manner equivalent to the resistor 31, so it is possible to detect the failure of the positive side diodes Dp by the similar operation of a failure detection circuit 30B.

In addition, a current set value of the constant current source 41 is also set to an appropriate current value so as to avoid false detection due to the above-mentioned salt water leakage.

As described above, according to the third embodiment of the present invention (FIG. 4 and FIG. 5), the power supply unit is provided with the first resistor 31 or the first constant current source 41 which is connected between the P terminal (detection terminal) and the ground terminal GND. Also, when the P terminal voltage VP is equal to the ground voltage VG, the determination circuit 32 in the failure holding circuit determines that the full-wave rectifier circuit 13 is normal, whereas when the P terminal voltage VP is equal to or higher than the first predetermined value VPF1 that is higher than the ground voltage VG, it is determined that the positive side diodes Dp of the full-wave rectifier circuit 13 are in a failure.

As a result, operational effects similar to those of the above-mentioned first and second embodiments can be achieved, and in addition, it is possible to further detect the short circuit failure of all the three-phase positive side diodes Dp based only on the state of the P terminal.

Embodiment 4

Figure 6:
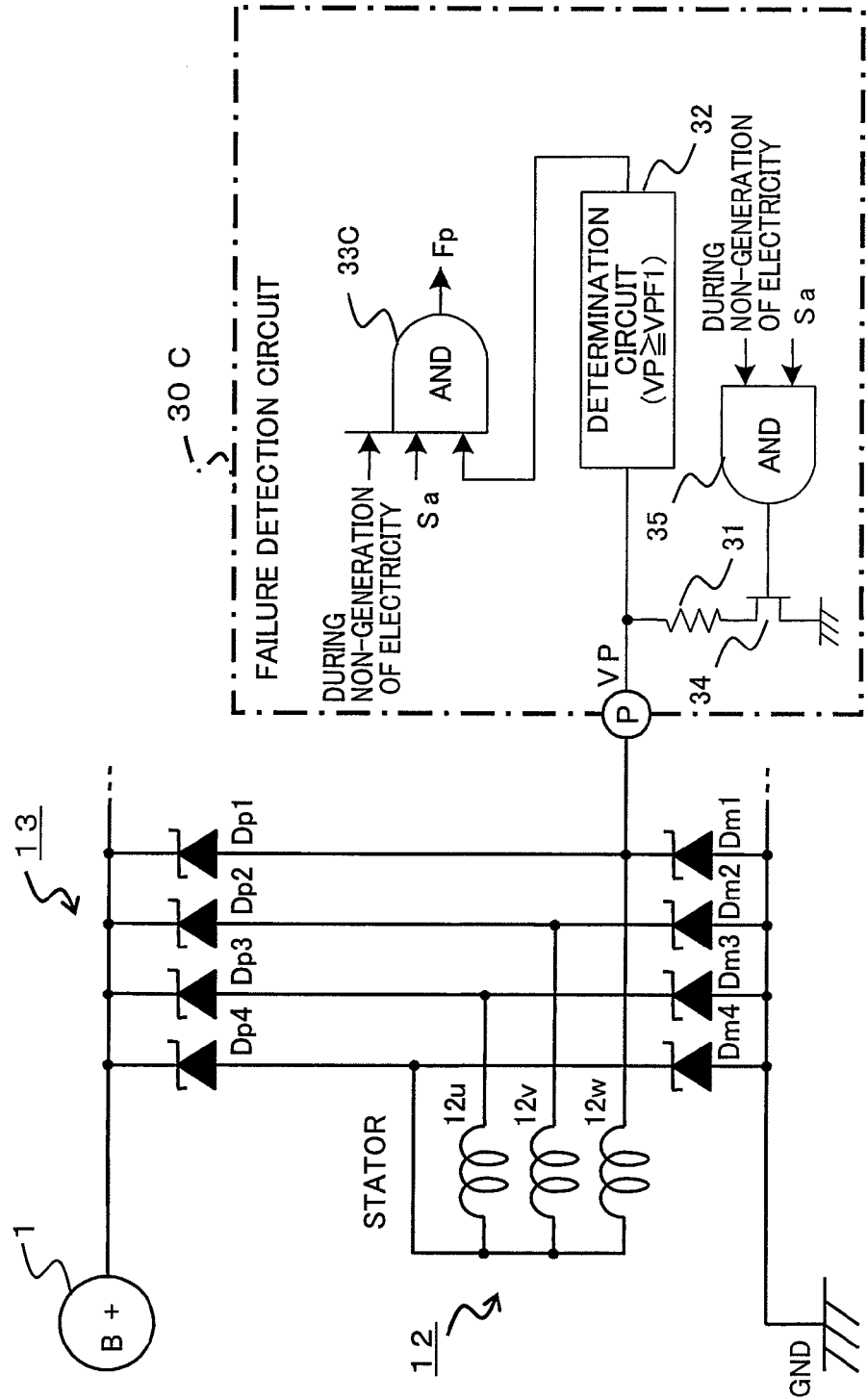
FIG. 6 is a functional block diagram showing a first configuration example of a failure detection apparatus for an alternator according to a fourth embodiment of the present invention.
Figure 7:
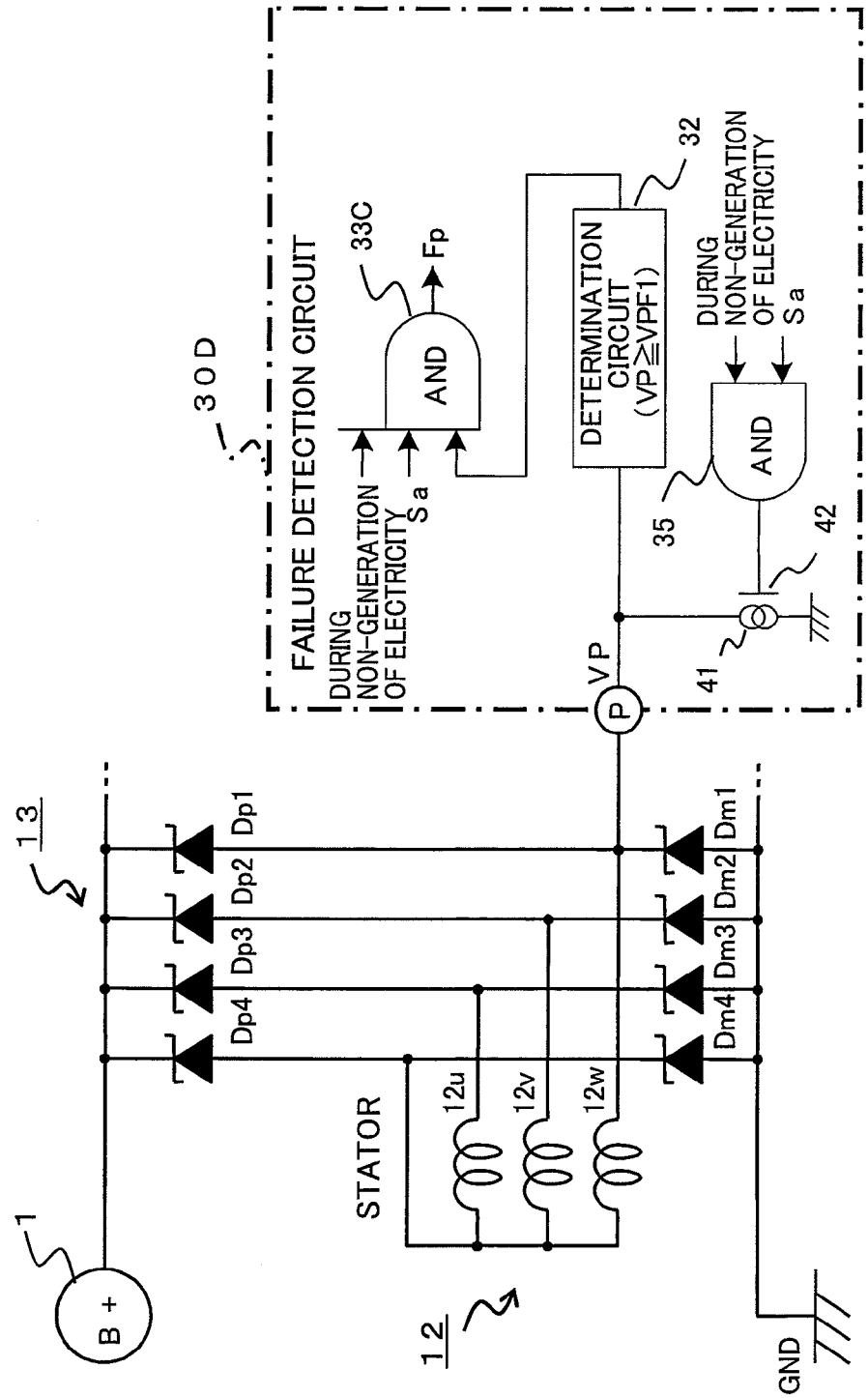
FIG. 7 is a functional block diagram showing a second configuration example of the failure detection apparatus for an alternator according to the fourth embodiment of the present invention.

Although in the above-mentioned third embodiment (FIG. 4 and FIG. 5), the resistor 31 or the constant current source 41 is made to be in a connected state regardless of whether electricity is generated or not, switches 34, 42 may be provided to the resistor 31 and the constant current source 41, respectively, as shown in FIG. 6 and FIG. 7, and the switches 34, 42 can be turned on by means of an AND gate 35 only when electricity is not generated.

FIG. 6 and FIG. 7 are functional block diagrams that show failure detection circuits 30C, 30D, respectively, according to a fourth embodiment of the present invention, wherein the same or like parts or elements as those described above (see FIG. 4 and FIG. 5) are identified by the same symbols while omitting a detailed description thereof.

FIG. 6 shows a case where the switch 34 is connected in series to the resistor 31, and FIG. 7 shows a case where the switch 42 is attached to the constant current source 41.

In FIG. 6 and FIG. 7, each of the failure detection circuits 30C, 30D has a pulse signal generation circuit (not shown), and the AND gate 35 generates a logical product of a non-power generation condition and a first pulse signal Sa (hereinafter simply referred to as a "pulse signal") as an output signal.

The switches 34, 42 are provided to the resistor 31 and the constant current source 41 (intentional GND directed impedance circuit for the P terminal), respectively, so that the switch 34 or 42 is turned on, as required during non-generation of electricity, by an output signal of the AND gate 35, whereby the resistor 31 or the constant current source 41 is made effective.

In this case, the switch 34 and the AND gate 35 in FIG. 6 constitute a power supply unit together with the resistor 31. Similarly, the switch 42 and the AND gate 35 in FIG. 7 constitute a power supply unit together with the constant current source 41.

In addition, an AND gate 33C at the side of a determination circuit 32 (in the failure holding circuit) has a pulse signal Sa added as an input signal (logical product condition), and operates in synchronization with the AND gate 35 at the switch side.

Here, note that the "non-power generation" condition (i.e., the condition of the "non-generation of electricity") is of course a condition for "detecting the failure of each of the diodes of the full-wave rectifier circuit 13 during non-generation of electricity".

Moreover, the pulse signal Sa serves to make the switches 34, 42 operate not in a continuous manner but in an intermittent manner. Accordingly, the switches 34, 42 operate in synchronization with the pulse signal Sa even during the time when electricity is not generated, so that they become to operate only at the on timing of the pulse signal Sa.

As described above, according to this fourth embodiment of the present invention (FIG. 6 and FIG. 7), the power supply unit is provided with the switch 34 or 42 that switches the resistor 31 or the constant current source 41, respectively, to a connected state and an interrupted state, and the switch 34 or 42 sets the resistor 31 or the constant current source 41, respectively, to the connected state in the non-power generation state of the armature coil 12. Accordingly, it is possible to detect the short circuit failure of all the three-phase positive side diodes Dp based only on the state of the P terminal, as stated above.

In addition, the resistor 31 in the failure determination circuit 30C or the constant current source 41 in the failure determination circuit 30D is separated or disconnected from the P terminal in the course of the power generation of the alternator 10, so useless power consumption at the P terminal can be suppressed, thereby making it possible to suppress the power consumption at the time of a diode failure of the full-wave rectifier circuit 13.

Moreover, the switches 34, 42 are intermittently separated or disconnected by the pulse signal Sa even during non-generation of electricity, so the useless power consumption at the P terminal can be further suppressed, and thus making it possible to further suppress the power consumption at the time of the diode failure of the full-wave rectifier circuit 13.

Embodiment 5

Figure 8:
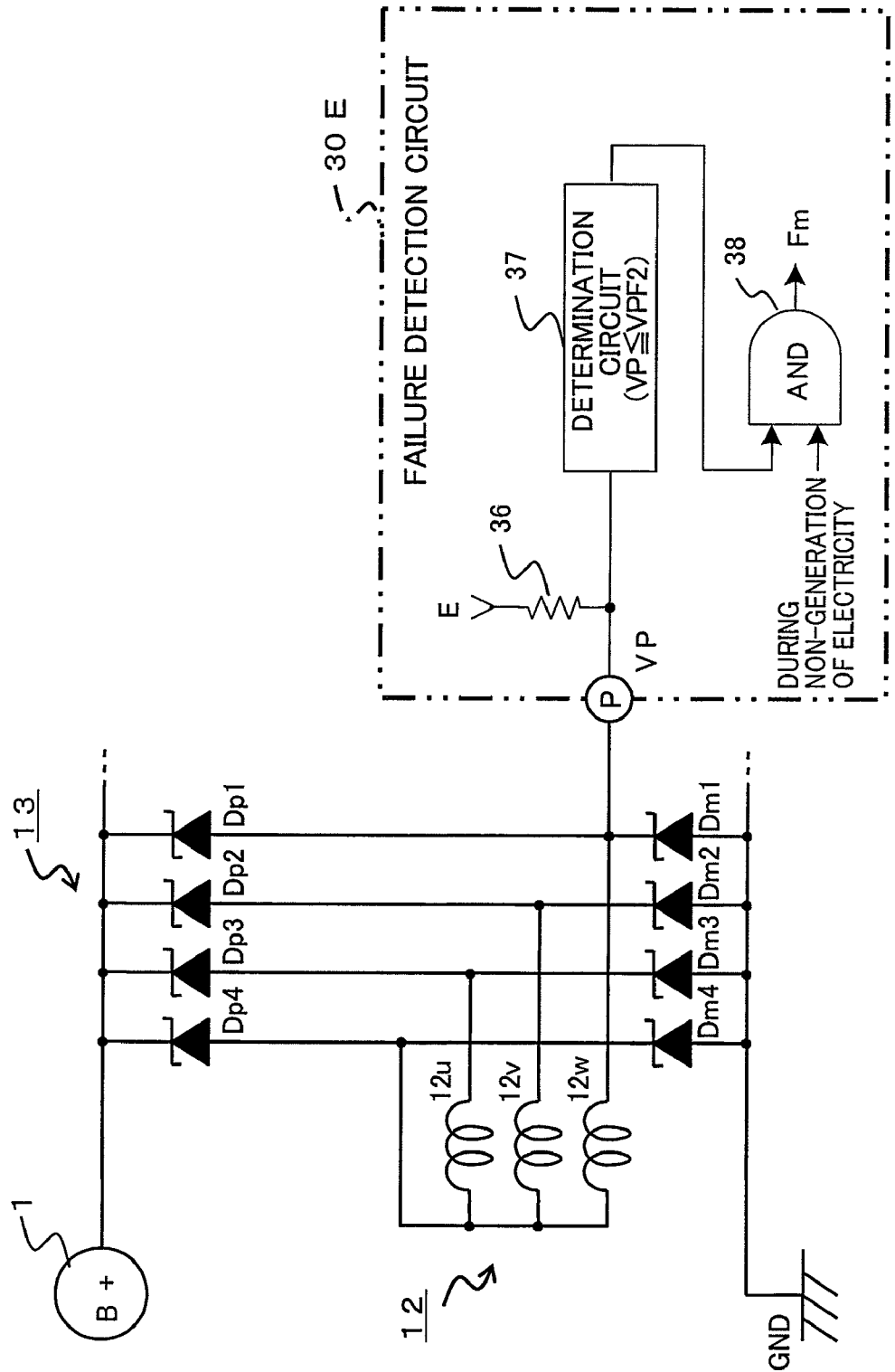
FIG. 8 is a functional block diagram showing a first configuration example of a failure detection apparatus for an alternator according to a fifth embodiment of the present invention.
Figure 9:
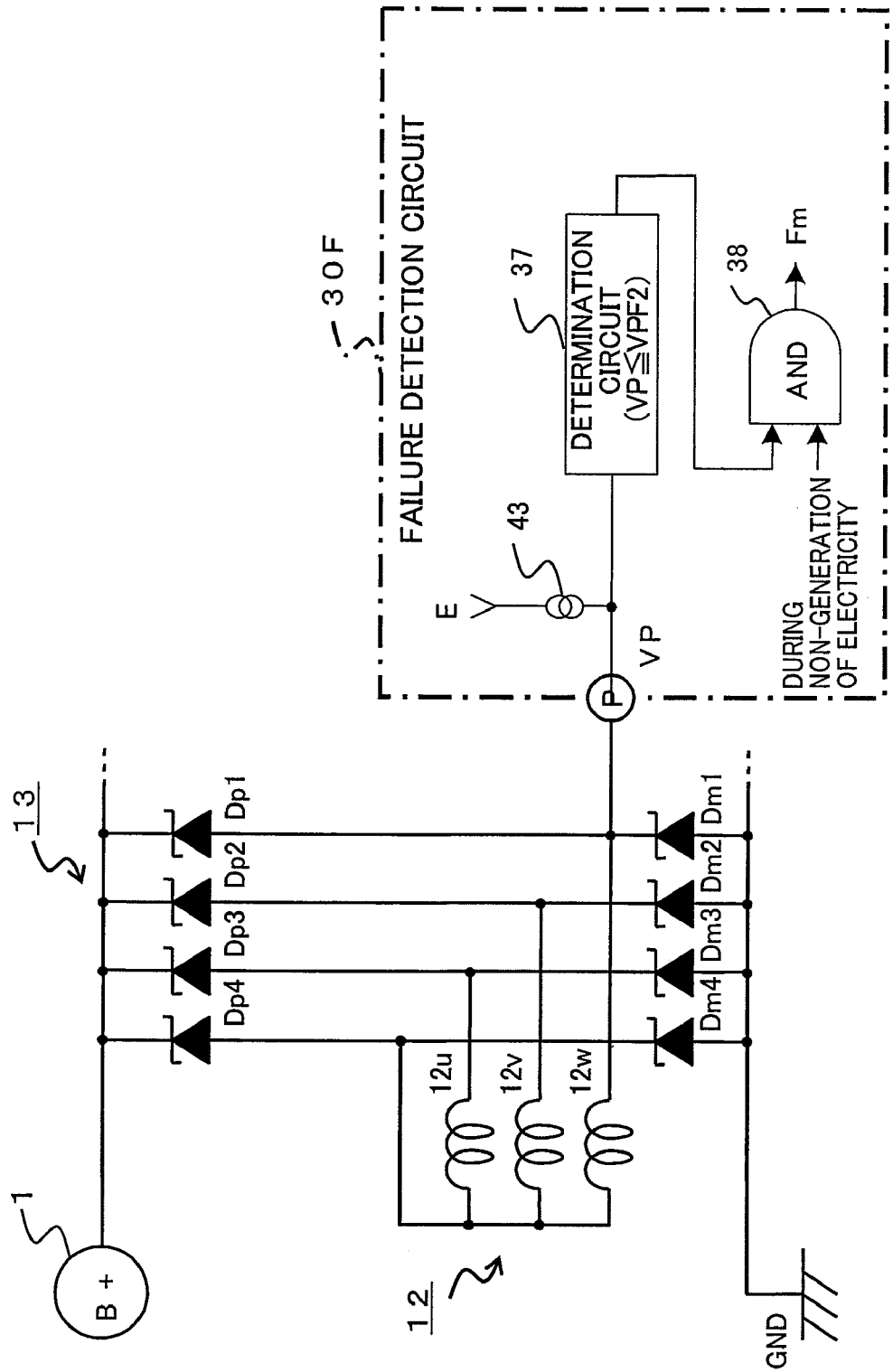
FIG. 9 is a functional block diagram showing a second configuration example of the failure detection apparatus for an alternator according to the fifth embodiment of the present invention.

In the above-mentioned third and fourth embodiments (FIG. 4 through FIG. 7), the resistor 31 or the constant current source 41 is inserted between the P terminal and the ground terminal GND for the purpose of the failure detection of the positive side diodes Dp, but in order to perform the failure detection of negative side diodes Dm, a second resistor (hereinafter simply referred to as a "resistor") 36 or a second constant current source (hereinafter simply referred to as a "constant current source") 43 may be inserted between a P terminal and a power supply E of a failure detection circuit 30E or 30F, as shown in FIG. 8 or FIG. 9.

FIG. 8 and FIG. 9 are functional block diagrams that show the failure detection circuits 30E, 30F, respectively, according to a fifth embodiment of the present invention, wherein the same or like parts or elements as those described above (see FIG. 4 through FIG. 7) are identified by the same symbols while omitting a detailed description thereof.

In FIG. 8, the failure detection circuit 30E includes a resistor 36 that is inserted between the P terminal and the power supply E, a determination circuit 37 that determines whether the P terminal voltage VP is equal to or less than a second predetermined value VPF2 (short circuit failure of the negative side diodes Dm), and an AND gate 38 that takes the logical product of a determination result of the determination circuit 37 and a non-power generation determination result thereby to output a failure determination signal Fm of the negative side diodes Dm.

In this case, the power supply E and the resistor 36 (intentional power supply circuit for the P terminal) correspond to a power supply unit, and the determination circuit 37 and the AND gate 38 correspond to a failure holding circuit. In addition, the power supply E may be a positive terminal of a battery 1 (battery voltage VB) or a power supply associated with the battery 1, or an internal power supply in the failure detection circuit 30E (voltage control circuit). Here, note that the second predetermined value VPF2 is set to a voltage that is lower than the battery voltage VB.

On the other hand, in FIG. 9, a constant current source 43 is provided as a power supply unit in the failure detection circuit 30F, in place of the resistor 36 in FIG. 8.

In FIG. 8 and FIG. 9, in case where any of the negative side diodes Dm of the full-wave rectifier circuit 13 in a short circuit failure, an impedance (resistance value) between the P terminal and the ground terminal GND (vehicle earth) is lowered than normal through the armature coil 12. Accordingly, the failure detection circuits 30E, 30F can detect the short circuit failure of the negative side diodes Dm by using the electrical property of the full-wave rectifier circuit 13, as seen from the P terminal, similarly as stated above.

For example, as shown in FIG. 8 and FIG. 9, in case where the resistor 36 or the constant current source 43 is provided as a power supply unit, the P terminal voltage VP at the time of non-generation of electricity becomes as close to the voltage value of the power supply "E" as possible due to the resistor 36 or the constant current circuit 43, which is connected to the power supply E, when the negative side diodes Dm of the full-wave rectifier circuit 13 are all normal.

On the other hand, when any of the negative side diodes Dm is in a short circuit failure, the P terminal voltage VP falls. That is, when a negative side diode Dm1 of a u phase is in a short circuit failure, the P terminal voltage VP falls. Similarly, when a negative side diode Dm2 of a v phase is in a short circuit failure, the P terminal voltage VP falls through armature coil elements 12w, 12v, and when a negative side diode Dm3 of a w phase is in a short circuit failure, the P terminal voltage VP falls through armature coil elements 12w, 12u.

In addition, when a negative side diode Dm4 at a neutral point is in a short circuit failure, the P terminal voltage VP falls through the armature coil element 12w. Accordingly, the determination circuit 37 makes a determination as to whether the P terminal voltage VP at the time of non-generation of electricity is equal to or less than the second predetermined value VPF2, and when it is shown that the value of the P terminal voltage VP is equal to or less than the second predetermined value VPF2 (i.e., VP≦VPF2), the determination circuit 37 outputs a determination result indicating the short circuit failure of the negative side diodes Dm.

The AND gate 38 outputs the logical product of the non-power generation condition and the determination result of the determination circuit 37 as a failure determination signal Fm indication the failure of the negative side diodes Dm.

Hereinafter, as stated above, the alarm driving transistor 26 is turned on in response to the failure determination signal Fm, whereby the alarm lamp 4 is driven to light.

Here, note that in case where the alternator 10 is a vehicular generator, there is a possibility that the P terminal voltage VP falls due to salt water leakage even if the negative side diodes Dm are normal, so the resistance value of the resistor 36 in FIG. 8 or the current value of the constant current source 43 in FIG. 9, and the second predetermined value VPF2 are set in an appropriate manner so as to avoid an incorrect failure determination due to salt water leakage.

As described above, according to the fifth embodiment of the present invention (FIG. 8 and FIG. 9), the power supply unit in the failure detection circuit 30E or 30F is provided with the second resistor 36 or the second constant current source 43, which is connected between the P terminal (detection terminal) and the positive terminal of the battery 1. Also, when the P terminal voltage VP is equal to the battery voltage VB, the determination circuit 37 in the failure holding circuit determines that the full-wave rectifier circuit 13 is normal, whereas when the P terminal voltage VP is equal to or less than the second predetermined value VPF2 which is lower than the battery voltage VB, the determination circuit 37 determines that either of the negative side diodes Dm of the full-wave rectifier circuit 13 is in a failure. Accordingly, it is possible to detect the short circuit failure of the negative side diodes Dm based only on the state of the P terminal, with a simple circuit structure.

Embodiment 6

Figure 10:
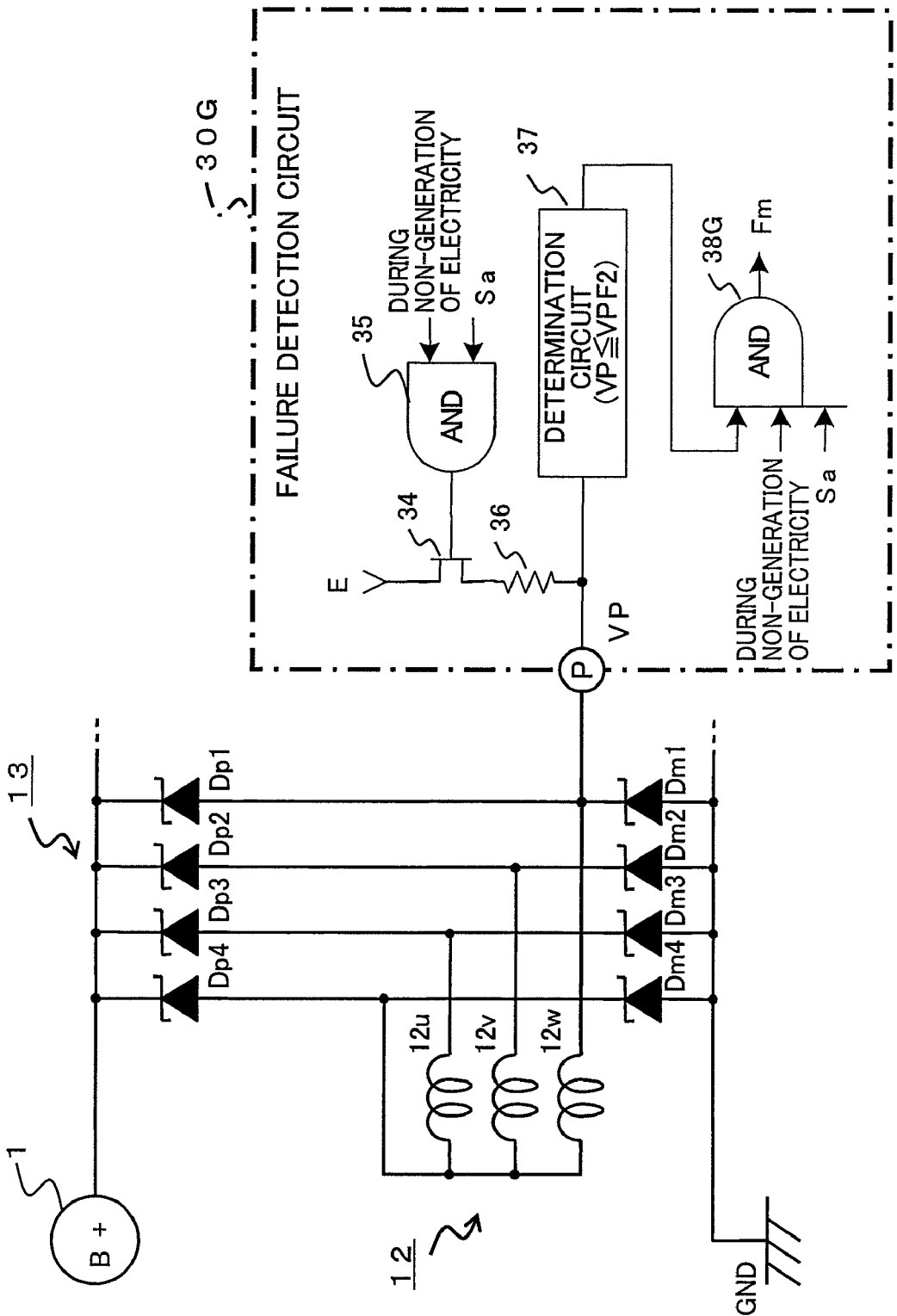
FIG. 10 is a functional block diagram showing a first configuration example of a failure detection apparatus for an alternator according to a sixth embodiment of the present invention.
Figure 11:
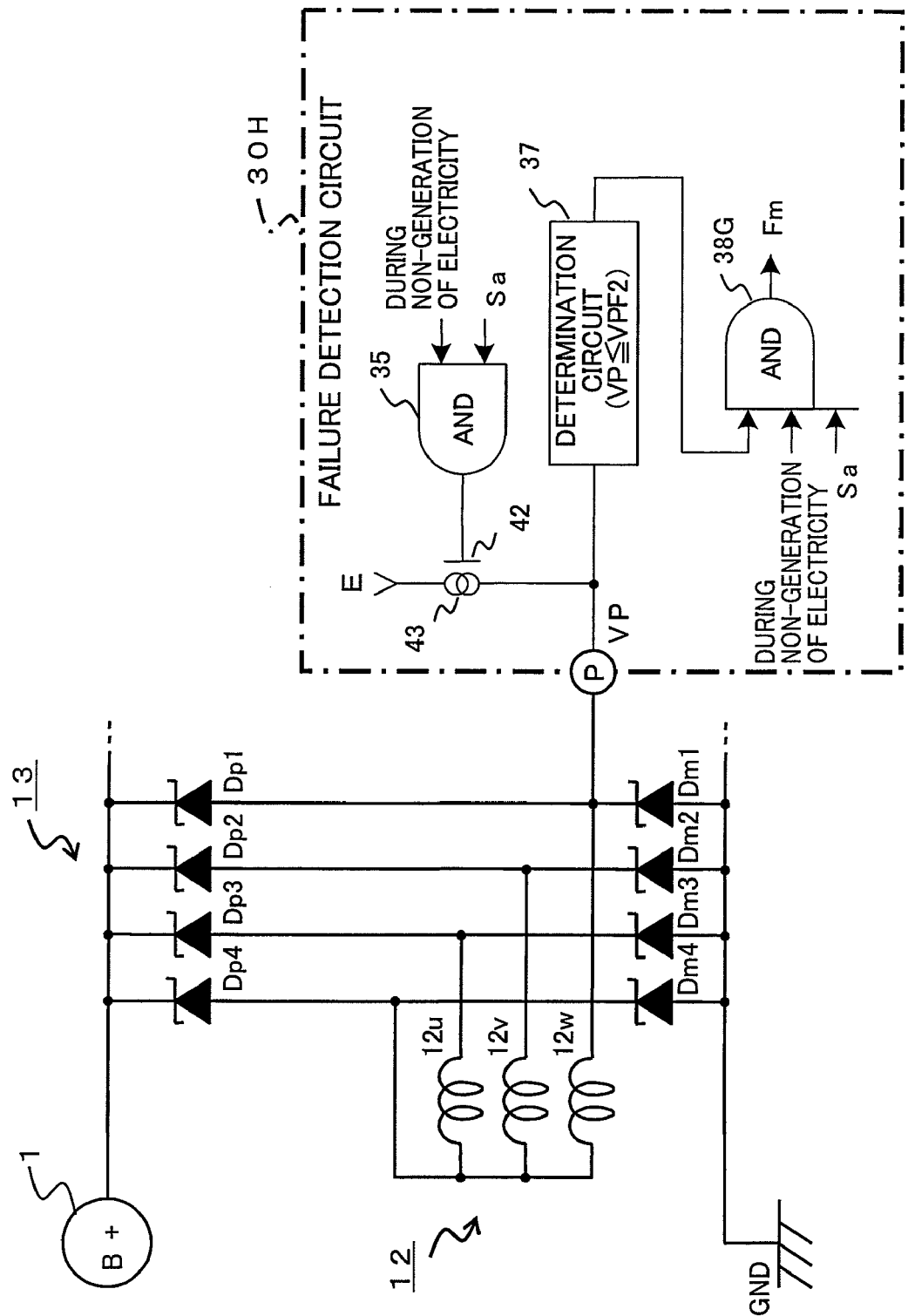
FIG. 11 is a functional block diagram showing a second configuration example of the failure detection apparatus for an alternator according to the sixth embodiment of the present invention.

Although in the above-mentioned fifth embodiment (FIG. 8 and FIG. 9), the resistor 36 or the constant current source 43 is made to be in a connected state regardless of whether electricity is generated or not, the switches 34, 42 may be provided to the resistor 36 and the constant current source 43, respectively, as shown in FIG. 10 and FIG. 11, so that the switches 34, 42 can be turned on by means of an AND gate 35 only during non-generation of electricity.

FIG. 10 and FIG. 11 are functional block diagrams that show failure detection circuits 30G, 30H, respectively, according to a sixth embodiment of the present invention, wherein the same or like parts or elements as those described above (see FIG. 6 through FIG. 9) are identified by the same symbols while omitting a detailed description thereof.

FIG. 10 shows a case where the switch 34 is connected in series to the resistor 36, and FIG. 11 shows a case where the switch 42 is attached to the constant current source 43. The individual switches 34, 42 and the AND gate 35 in FIG. 10 and FIG. 11 have the same functions as those of the individual switches and the AND gate in the above-mentioned fourth embodiment (FIG. 6 and FIG. 7).

That is, the switches 34, 42 are operated to be turned on by an output signal of the AND gate 35 only when required during non-generation of electricity and only when a pulse signal Sa is on, whereby the resistor 36 or the constant current source 43 is made effective.

In addition, an AND gate 38G at the side of a determination circuit 37 operates in synchronization with the on timing of the pulse signal Sa, similar to the above-mentioned AND gate 33C (FIG. 6 and FIG. 7).

As described above, according to the sixth embodiment of the present invention (FIG. 10 and FIG. 11), the switches 34, 42 for making and breaking the connection of the resistor 36 and the constant current circuit 43, respectively, are provided as a power supply unit (intentional power supply circuit) for the P terminal, and by operating the power supply unit only when required, it is possible to suppress useless power consumption at the P terminal during generation of electricity, as in the case of the above-mentioned fourth embodiment.

In addition, by operating the power supply unit (the resistor 36 or the constant current circuit 43) in an intermittent manner only at the on timing of the pulse signal Sa during non-generation of electricity, it is possible to further suppress the power consumption at the time of diode failure of the full-wave rectifier circuit 13.

Embodiment 7

Figure 12:
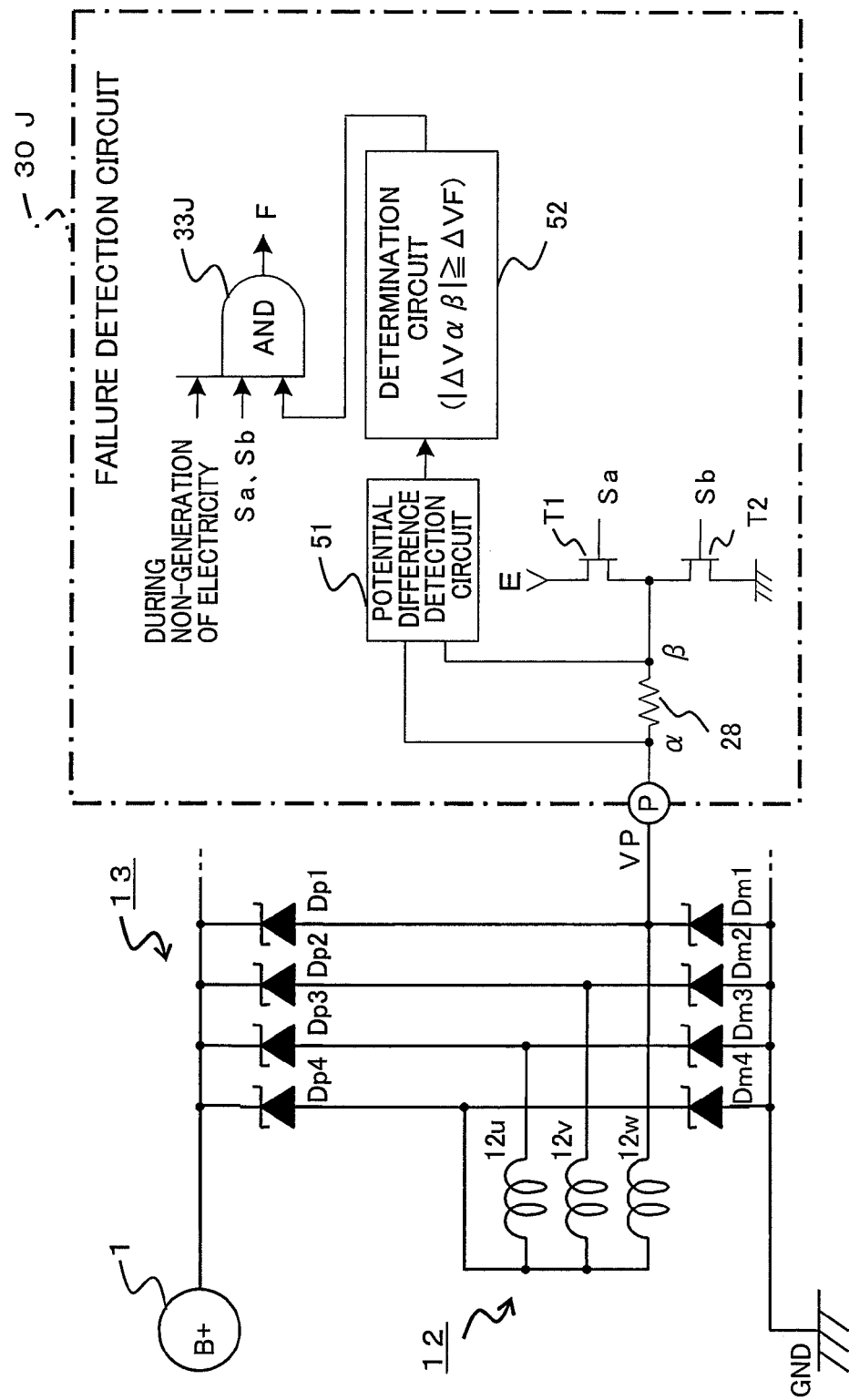
FIG. 12 is a functional block diagram showing essential portions of a failure detection apparatus for an alternator according to a seventh embodiment of the present invention.

Although in the above-mentioned fourth and sixth embodiments (FIG. 4, FIG. 7, FIG. 10 and FIG. 11), the power consumption at the time of failure of only either one of the positive side diodes Dp and the negative side diodes Dm is suppressed, it may be constructed such that the power consumption can be suppressed even at the time of failure of any of the positive side diodes Dp and the negative side diodes Dm, as in the case of a failure detection circuit 30J shown in FIG. 12.

FIG. 12 is a functional block diagram that shows the failure detection circuit 30J according to a seventh embodiment of the present invention, wherein the same or like parts or elements as those described above are identified by the same symbols while omitting a detailed description thereof.

In FIG. 12, the failure detection circuit 30J includes transistors (semiconductor switches) T1, T2 that are inserted between a power supply E (e.g., positive terminal of a battery 1) and a ground terminal GND, a current limiting resistor 28 that is inserted between a junction between the transistors T1, T2 and a P terminal, a potential difference detection circuit 51 that detects a potential difference $\Delta V\alpha\beta$ between opposite ends $\alpha$, $\beta$ of the current limiting resistor 28, a determination circuit 52 that determines whether the absolute value of the potential difference $\Delta V\alpha\beta$ is equal to or larger than a predetermined value $\Delta VF$, and an AND gate 33J that outputs a failure determination signal F.

The transistors T1, T2 and the current limiting resistor 28 together constitute a power supply unit similar to that in the above-mentioned second embodiment (FIG. 3). The potential difference detection circuit 51 corresponds to the above-mentioned voltage comparison circuit 29, and the potential difference detection circuit 51, the determination circuit 52 and the AND gate 33 correspond to the above-mentioned failure holding circuit 25.

The transistor T1 is driven to be turned on by a pulse signal Sa, and the transistor T2 is driven to be turned on by a second pulse signal (hereinafter simply referred to as a "pulse signal") Sb which is turned on in a complementary manner with respect to the pulse signal Sa.

The determination circuit 52 makes a comparison between the potential difference $\Delta V\alpha\beta$ between the opposite ends of the current limiting resistor 28 and the predetermined value $\Delta VF$, and when the relation of $|\Delta V\alpha\beta| \geqq \Delta VF$ is satisfied, it outputs a determination result indicating a failure to the AND gate 33J.

The AND gate 33J takes the logical product of a non-power generation condition and a determination result of the determination circuit 52, and operates in synchronization with the pulse signals Sa, Sb, so that it outputs a failure determination signal F indicating the failure of the positive side diodes Dp or the negative side diodes Dm.

The failure detection circuit 30J captures the change of an impedance in a direction of the battery 1 (vehicle power supply) or the change of an impedance in a direction of the ground terminal GND (vehicle earth) at the P terminal, which is generated upon diode short circuit failure of the full-wave rectifier circuit 13 by alternately turning on the transistors T1, T2 by means of the pulse signals Sa, Sb.

That is, similarly as stated above, when any of the positive side diodes Dp of the full-wave rectifier circuit 13 is in a short circuit failure, the impedance (resistance value) between the P terminal and the battery 1 becomes lower than normal, whereas when any of the negative side diodes Dm is in a short circuit failure, the impedance between the P terminal and the ground terminal GND (vehicle earth) becomes lower than normal.

Accordingly, the failure detection circuit 30J can detect the short circuit failures of the positive side diodes Dp and the negative side diodes Dm by using the electrical property of the full-wave rectifier circuit 13, as seen from the P terminal.

For example, in case where any of the positive side diodes Dp of the full-wave rectifier circuit 13 is in a short circuit failure, the impedance between the P terminal and the battery 1 (vehicle power supply) lowers, and current flows from the terminal a of the current limiting resistor 28 toward the terminal thereof.

On the other hand, when any of the negative side diodes Dm is in a short circuit failure, the impedance between the P terminal and the ground terminal GND (vehicle earth) lowers, and current flows from the terminal 6 of the current limiting resistor 28 toward the terminal a in the opposite polarity to the above.

In either case, when current flows to the current limiting resistor 28, the potential difference $\Delta V\alpha\beta$ is generated between the opposite ends $\alpha\beta$ thereof, so the potential difference detection circuit 51 detects the potential difference $\Delta V\alpha\beta$, and the determination circuit 52 determines whether the potential difference $\Delta V\alpha\beta$ is equal to or larger than the predetermined value $\Delta VF$ (diode short circuit failure).

When it is determined as "$\Delta V\alpha\beta \geqq \Delta VF$" (being in a diode failure) in the determination circuit 52, the AND gate 33J takes the logical product of the determination result of the determination circuit 52, the non-power generation condition, and the logical sum of the pulse signals Sa, Sb, and outputs a failure determination signal F indicating the diode failure state of the full-wave rectifier circuit 13.

Hereinafter, the alarm lamp 4 is driven to light in response to the failure determination signal F.

In addition, the transistor T1 is inserted between the current limiting resistor 28 and the power supply E, and the transistor T2 is inserted between the current limiting resistor 28 and the ground terminal GND, whereby the power consumption in the failure detection circuit 30J can be suppressed by turning on the individual transistors T1, T2 in a complementary manner, and at the same time by turning off the transistors T1, T2 when unnecessary.

As described above, according to this seventh embodiment of the present invention (FIG. 12), it is possible to detect the failures of both of the positive side diodes Dp and the negative side diodes Dm of the full-wave rectifier circuit 13, while making it possible to suppress the power consumption.

Embodiment 8

Figure 13:
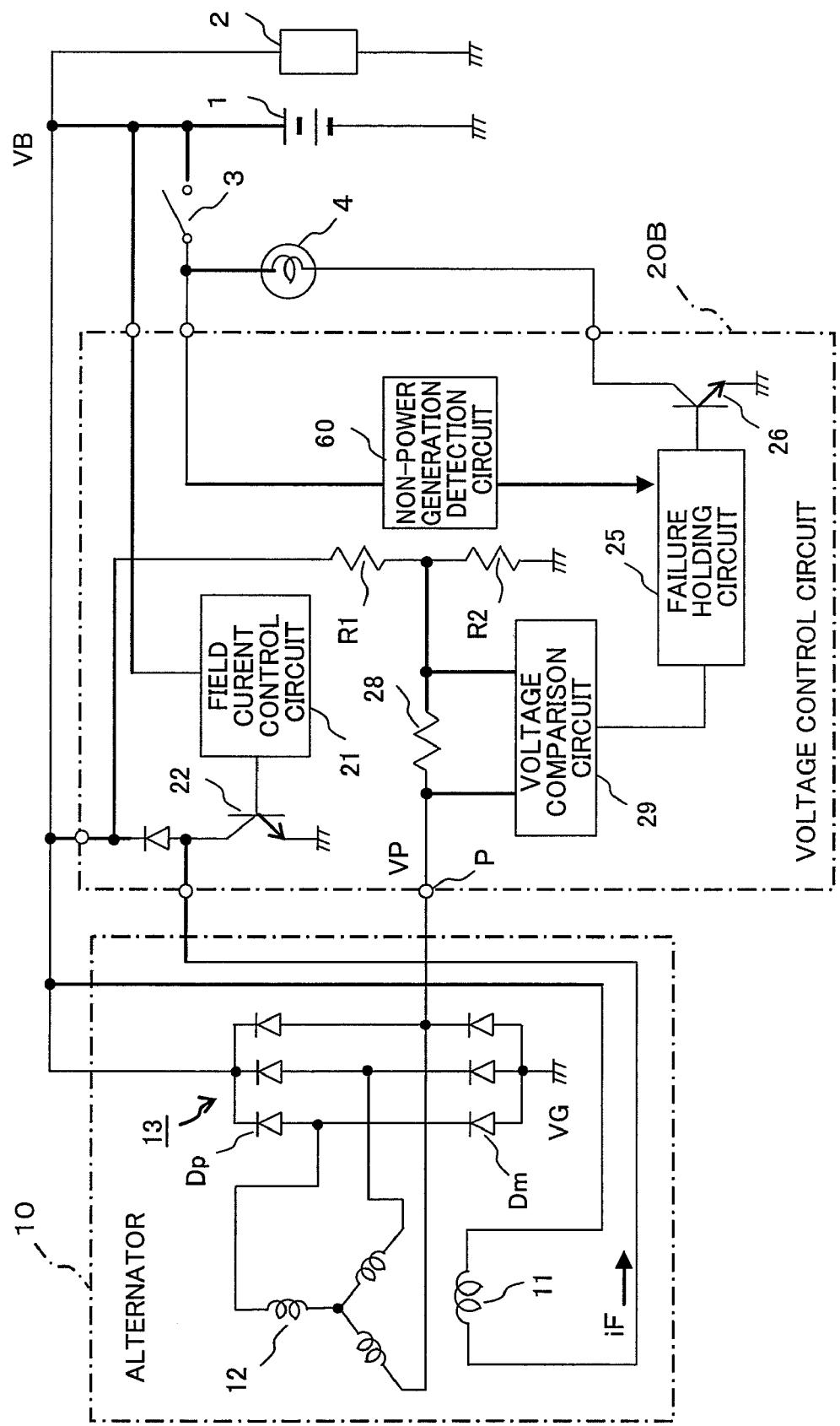
FIG. 13 is a functional block diagram showing a failure detection apparatus for an alternator according to an eighth embodiment of the present invention.

Although in the above-mentioned seventh embodiment (FIG. 12), the transistors T1, T2 in the form of semiconductor switches are used, voltage dividing resistors R1, R2 connected in series to each other may instead be used, as shown in FIG. 13.

FIG. 13 is a functional block diagram that show a voltage control circuit 20B (including a failure detection circuit) according to an eighth embodiment of the present invention, wherein the same or like parts or elements as those described above (see FIG. 3) are identified by the same symbols while omitting a detailed description thereof.

In FIG. 13, the voltage control circuit 20B is provided with the voltage dividing resistors R1, R2, and a non-power generation detection circuit 60 in place of the above-mentioned transistors T1, T2 and drive switching circuit 27 (FIG. 3).

The voltage dividing resistors R1, R2 serve to divide a voltage between a battery 1 and a ground terminal GND, and supply a divided voltage thus obtained to a P terminal through a current limiting resistor 28.

In addition, the non-power generation detection circuit 60 produces a non-power generation determination signal in response to an on operation of a key switch 3, thereby making a failure holding circuit 25 effective.

Here, note that the voltage dividing resistors R1, R2, which together constitute a power supply unit, can be replaced by a constant current source, as stated above. In this case, if all the diodes of a full-wave rectifier circuit 13 are normal, the divided voltage and a P terminal voltage VP during non-generation of electricity become equal to each other, and current does not flow through the current limiting resistor 28, so a voltage comparison result of a comparison circuit 29 will show a voltage difference of "0" (a normal state).

Accordingly, the failure holding circuit 25 stores that the full-wave rectifier circuit 13 is normal, and shifts to an ordinary electric power generation mode without turning on an alarm lamp 4.

On the other hand, when any of positive side diodes Dp is in a short circuit failure, the P terminal voltage VP becomes equal to a battery voltage VB, and current flows through the current limiting resistor 28, so the flow of current through the current limiting resistor 28 can be detected by measuring a voltage between opposite ends of the current limiting resistor 28.

In addition, when any of negative side diodes Dm comes to a short circuit failure, the ground voltage VG becomes equal to the P terminal voltage VP, and current flows through the current limiting resistor 28, so the flow of current through the current limiting resistor 28 can be detected by measuring a voltage between the opposite ends of the current limiting resistor 28.

In any case, if current flows through the current limiting resistor 28, the failure holding circuit 25 stores the short circuit failure state of the diodes, and turns on the alarm lamp 4.

Here, note that in case where Zener diodes are used as the diodes of the full-wave rectifier circuit 13, when one of a pair of diodes of a certain phase is opened (comes to an open circuit failure), the voltage of that phase exceeds the Zener voltage of the other of the paired diodes, and destroys the other diode pairing with the open failed diode to cause it into a short circuit failure, as a result of which the failure state of the full-wave rectifier circuit 13 can be detected by use of the failure detection circuit of the present invention.

Also, in case where the alternator 10 is a vehicular generator having two independent (not electrically connected) three-phase circuits, the short circuit failure of the diodes of the individual three-phase circuits can be detected by the provision of two failure detection circuits of the present invention.

As described above, according to the eighth embodiment of the present invention (FIG. 13), by using the simple power supply circuit comprising the voltage dividing resistors R1, R2, it is possible to detect the failure of both of the positive side diodes Dp and the negative side diodes Dm of the full-wave rectifier circuit 13 with a high degree of precision by use of a simple circuit structure.

Embodiment 9

Figure 14:
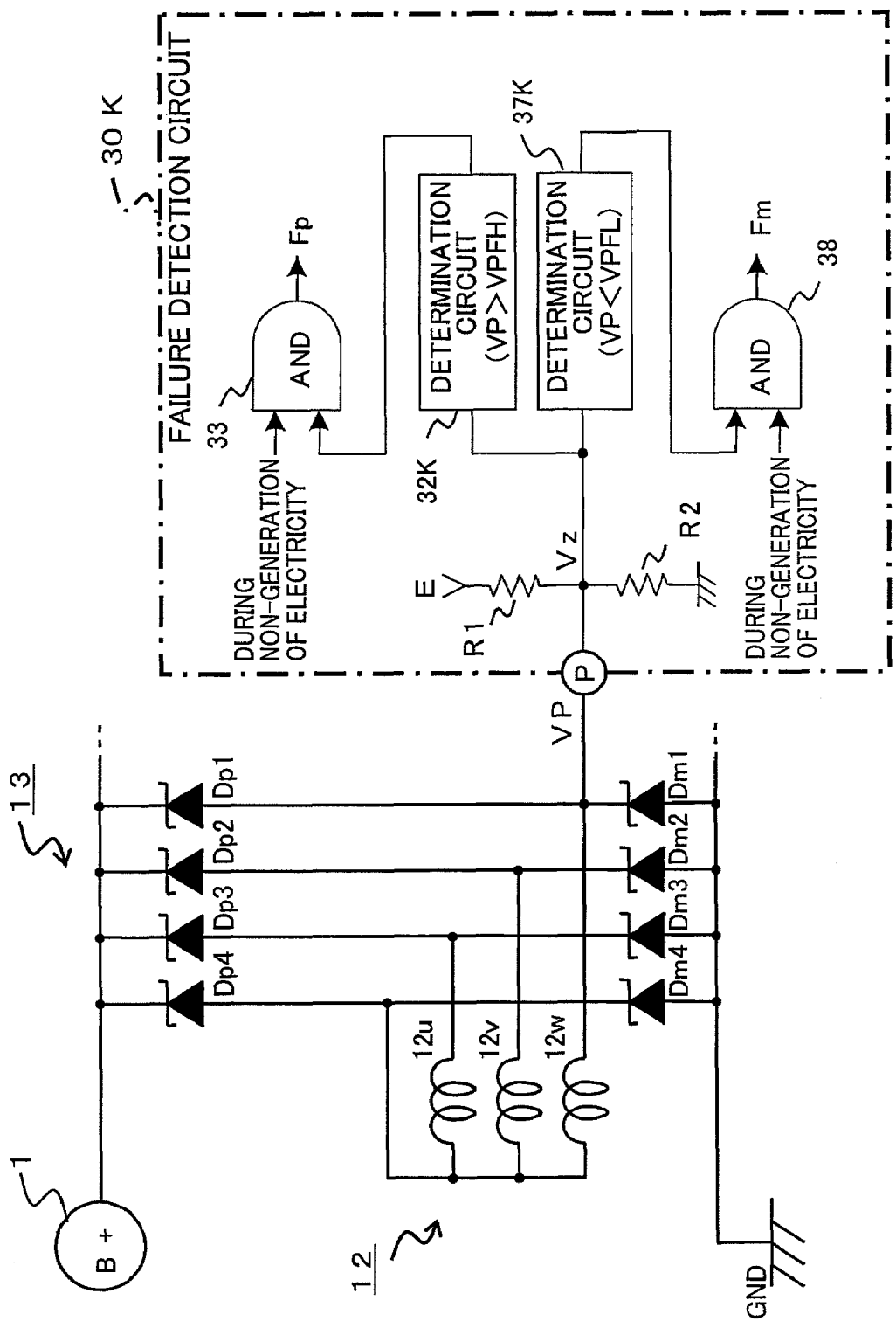
FIG. 14 is a functional block diagram showing essential portions of a failure detection apparatus for an alternator according to a ninth embodiment of the present invention.

Although in the above-mentioned eighth embodiment (FIG. 13), the current limiting resistor 28 is inserted between the P terminal and the voltage dividing resistors R1, R2, the voltage dividing resistors R1, R2 may be respectively connected in series to the P terminal, as shown in FIG. 14, so that a failure determination can be made based on a divided voltage Vz at a connection point or junction of the resistors R1, R2 supplied to the P terminal.

FIG. 14 is a functional block diagram that shows a failure detection circuit 30K according to a ninth embodiment of the present invention, wherein the same or like parts or elements as those described above are identified by the same symbols or by the same symbols with "K" affixed to their ends, while omitting a detailed description thereof.

In FIG. 14, the failure detection circuit 30K includes the voltage dividing resistors R1, R2 with a voltage divided voltage point connected to the P terminal, a pair of determination circuits 32K, 37K that perform a failure determination by comparing the divided voltage Vz with a first predetermined value (an upper limit value within a predetermined voltage range) VPFH and a second predetermined value (a lower limit value within the predetermined voltage range) VPFL, respectively, and a pair of AND gates 33, 38 that take the logical products of individual determination results of the determination circuits 32K, 37K and a non-power generation determination result thereby to output failure determination signals Fp, Fm, respectively.

The voltage dividing resistors R1, R1 constitute a power supply unit, and generate the divided voltage Vz (predetermined voltage) which is equal to or lower than a battery voltage VB and is equal to or higher than a ground voltage GND. In addition, the determination circuits 32K, 37K and the AND gates 33, 38 together constitute a failure holding circuit, and serve to detect and hold the failure of the positive side diodes Dp and the negative side diodes Dm.

In the failure detection circuit 30K of FIG. 14, too, when the diodes of the full-wave rectifier circuit 13 are normal, the divided voltage Vz of the resistors R1, R2 obtained with a power supply E (i.e., the battery 1, a power supply related to the battery 1, or an internal power supply of the failure detection circuit 30K) does not deviate from a voltage range that is expected based on the individual resistance values of the resistors R1, R2.

On the other hand, when any of the diodes of the full-wave rectifier circuit 13 comes to a short circuit failure, an impedance in a direction of the battery 1 (vehicle power supply), or an impedance in a direction of the ground terminal GND (vehicle earth), of the P terminal is lowered in the diodes, so that the value of the divided voltage Vz rises in the case of failure of the negative side diodes Dm, but falls in the case of failure of the positive side diodes Dp.

Accordingly, the determination circuit 32K determines whether the P terminal voltage VP is higher than the first predetermined value (upper limit value) VPFH, and when VP>VPFH, the determination circuit 32K outputs a determination result indicating the failure of the positive side diodes Dp.

On the other hand, the determination circuit 37K determines whether the P terminal voltage VP is lower than the second predetermined value (lower limit value) VPFL, and when VP<VPFL, the determination circuit 37K outputs a determination result indicating the failure of the negative side diodes Dm.

The AND gates 33, 38 take the logical products of the determination results of the individual determination circuits 32K, 37K and a non-power generation condition, respectively, and output the failure determination signal Fp for the positive side diodes Dp and the failure determination signal Fm for the negative side diodes Dm, respectively.

Hereinafter, as stated above, the failure detection circuit 30K drives the alarm lamp 4 so as to warn that the diode failure of the full-wave rectifier circuit 13 has been detected.

As described above, according to the ninth embodiment of the present invention of the present invention (FIG. 14), the power supply unit is provided with the voltage dividing resistors R1, R2 (power supply) connected to the P terminal (detection terminal), and the power supply has an output impedance (resistance value), and generates the predetermined voltage which is equal to or lower than the battery voltage VB and is also equal to or higher than the ground voltage GND.

In addition, when the P terminal voltage VP does not deviate from the predetermined voltage range, the determination circuits 32K, 37K (failure holding unit) determines that the diodes of the full-wave rectifier circuit 13 are normal, whereas when the P terminal voltage VP is lower than the second predetermined value (the lower limit value within the predetermined voltage range) VPFL, it is determined that the negative side diodes Dm are in a short circuit failure, and when the P terminal voltage VP is higher than the first predetermined value (the upper limit value within the predetermined voltage range) VPFH, it is determined that the positive side diodes Dp are in a short circuit failure.

Moreover, in this case, the alternator 10 (alternating current generator) and the battery 1 are on-board devices that are installed on a vehicle, and the predetermined voltage generated by the power supply unit is produced by dividing the battery voltage VB by means of the two voltage dividing resistors R1, R2 (serially connected resistors). As a result, the diode short circuit failure of the full-wave rectifier circuit 13 can be detected with a high degree of precision by use of a simple circuit structure, as stated above.

Embodiment 10

Figure 15:
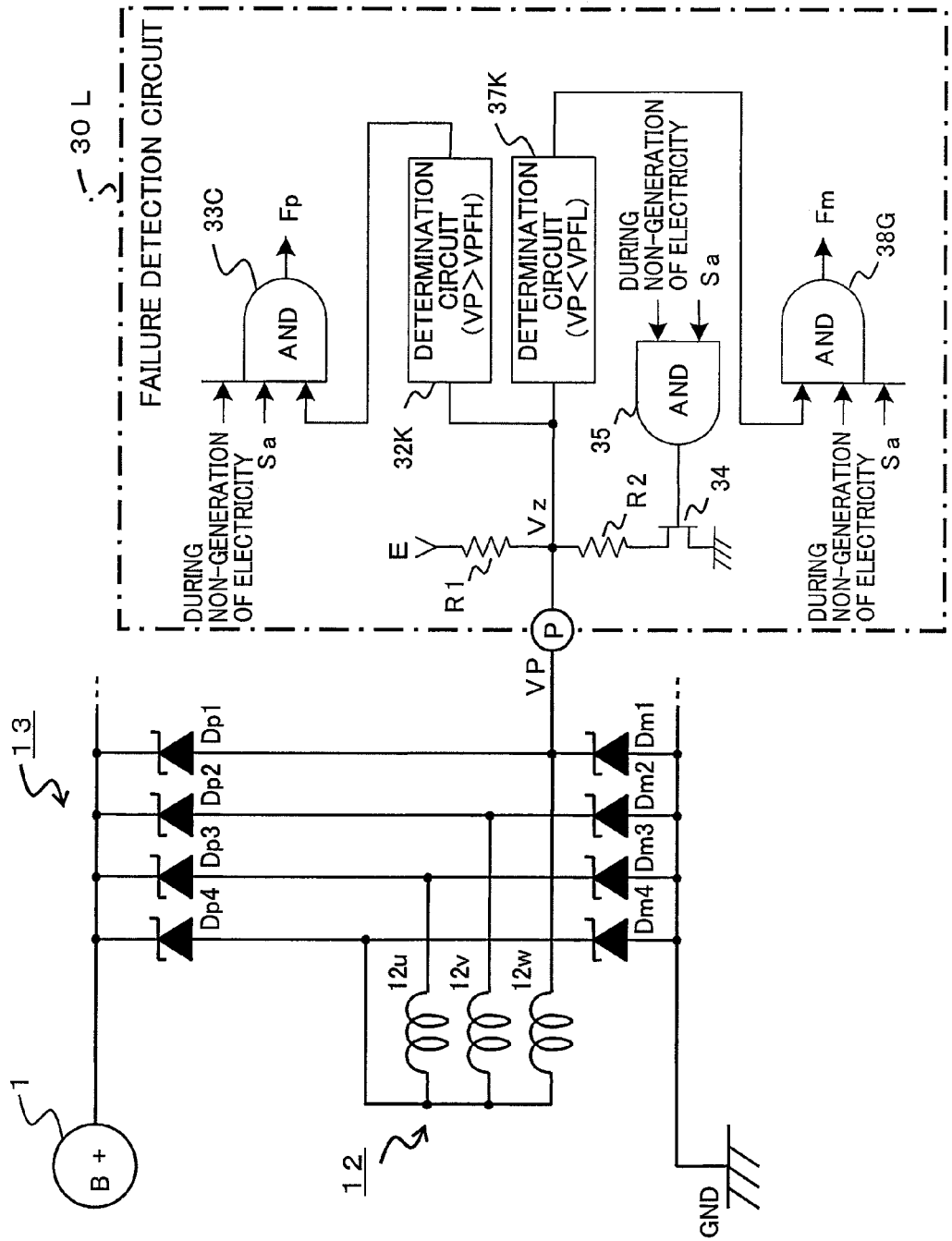
FIG. 15 is a functional block diagram showing essential portions of a failure detection apparatus for an alternator according to a tenth embodiment of the present invention.

In the above-mentioned ninth embodiment (FIG. 14), it is constructed such that the voltage dividing resistors R1, R2 are constantly inserted between the power supply side and the ground side, but for the purpose of suppressing the power consumption, provision may instead be made for a switch (semiconductor switch) 34 for switching between the voltage dividing resistors, as shown in FIG. 15, in such a manner that the voltage dividing resistors R1, R2 can be made effective only when required.

FIG. 15 is a functional block diagram that shows a failure detection circuit 30L according to a tenth embodiment of the present invention, wherein the same or like parts or elements as those described above (see FIG. 6, FIG. 10 and FIG. 14) are identified by the same symbols while omitting a detailed description thereof.

In FIG. 15, the failure detection circuit 30L is provided with the switch 34 that is inserted between a voltage dividing resistor R2 and a he ground terminal GND, and an AND gate 35 that serves to open and close the switch 34.

In this case, a pulse signal Sa for opening and closing the AND gate 35 of the switch 34 is input to AND gates 33C, 38G that serve to output failure determination signals Fp, Fm, respectively.

As shown in FIG. 15, the switch 34 is arranged between the voltage dividing resistor R2 and the ground terminal GND in such a manner that the switch 34 is opened and closed by the AND gate 35 thereby to turn on the function of the voltage dividing resistors R1, R2 during non-generation of electricity, and at the same time, to turn off the function of the voltage dividing resistors R1, R2 when not required (during generation of electricity), whereby the power consumption in the failure detection circuit 30L can be suppressed.

In addition, even during the non-generation of electricity, the function of the voltage dividing resistors R1, R2 is turned on only upon occurrence of an on input of the pulse signal Sa, and at the same time, the failure determination function is also made in conditional association with the operation of the switch 34, so the power consumption can be further suppressed.

Here, note that even if the switch 34 is inserted between a power supply E and the voltage dividing resistor R1, as stated above (FIG. 10), similar operational effects can be obtained.

Moreover, by inserting switches on both the power supply side and the ground side, respectively, and controlling the individual switches in synchronization with each other so as to turn on them only when necessary, it is possible to avoid unnecessary and useless current consumption at the time of diode failure in a reliable manner, whereby the power consumption can be further suppressed.

As described above, according to the tenth embodiment of the present invention (FIG. 15), the power supply unit is provided with the switch 34 that switches the power supply E between a connected state and an interrupted state, and the switch 34 serves to set the power supply E to the connected state in a non-power generation state of the armature coil 12, as a result of which the power consumption can be suppressed.

Embodiment 11

Figure 16:
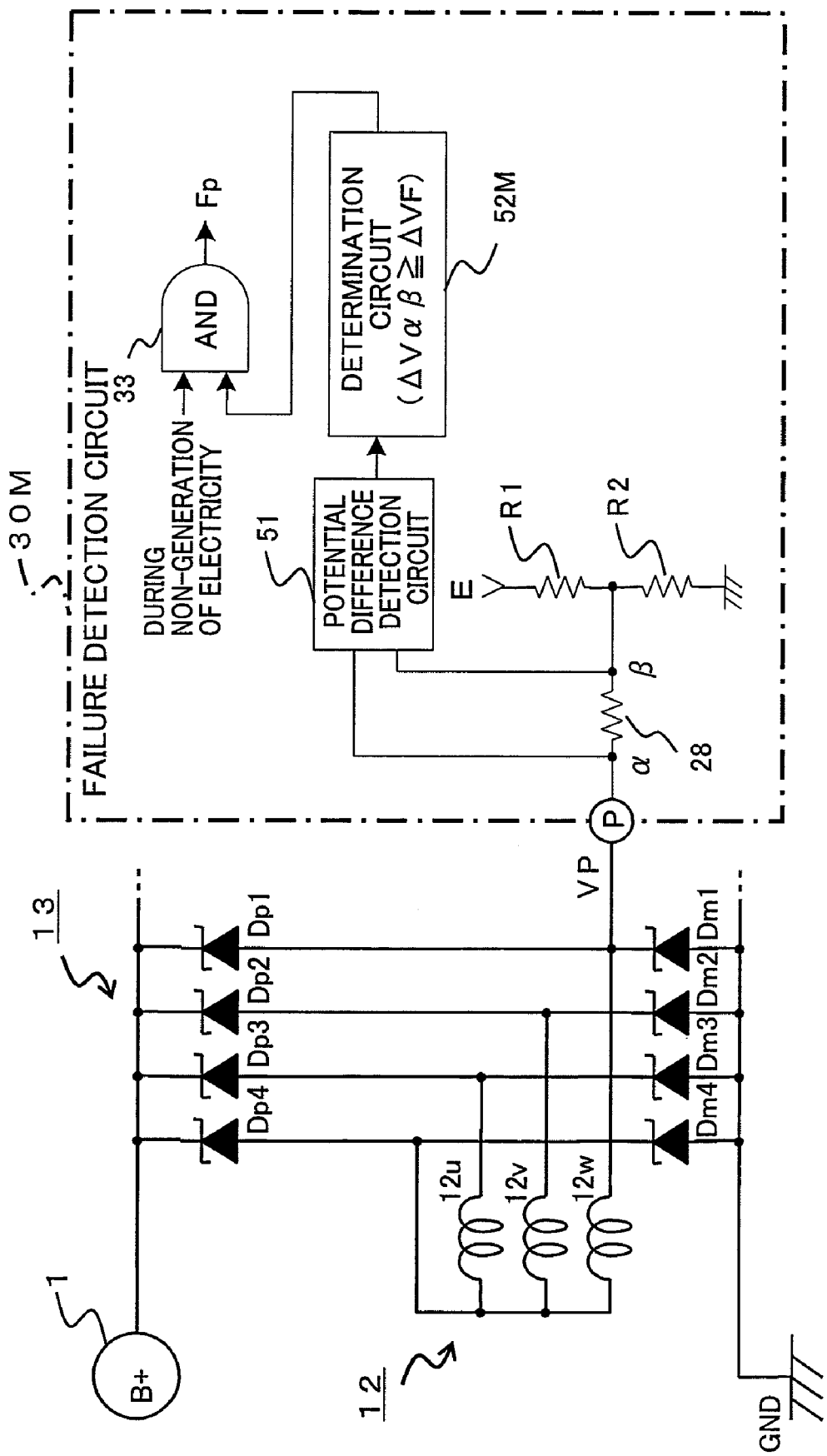
FIG. 16 is a functional block diagram showing essential portions of a failure detection apparatus for an alternator according to an eleventh embodiment of the present invention.

Although in the above-mentioned the eighth embodiment (FIG. 13), no specific mention has been made to a determination function in the failure holding circuit 25, such a determination function may be constructed as shown by a failure detection circuit 30M in FIG. 16, similar to the above-mentioned seventh embodiment (FIG. 12).

FIG. 16 is a functional block diagram that shows a failure detection circuit 30M according to an eleventh embodiment of the present invention, wherein the same or like parts or elements as those described above (see FIG. 12 and FIG. 13) are identified by the same symbols or by the same symbols with "M" affixed to their ends, while omitting a detailed description thereof.

In FIG. 16, a current limiting resistor 28 and voltage dividing resistors R1, R2 together constitute a power supply unit, and a potential difference detection circuit 51, a determination circuit 52M and an AND gate 33 together constitute the above-mentioned failure holding circuit 25 (FIG. 13).

The determination circuit 52M determines whether a potential difference $\Delta V\alpha\beta$ between opposite ends of the current limiting resistor 28 is equal to or larger than a predetermined value $\Delta VF$, and when $\Delta V\alpha\beta \geq \Delta VF$, it outputs a determination result indicating the failure of positive side diodes Dp. The AND gate 33 takes the logical product of the determination result of the determination circuit 52M and a non-power generation condition, and outputs a failure determination signal Fp indicating the failure state of the positive side diodes Dp.

Hereinafter, an alarm lamp 4 is driven to light in response to the failure determination signal Fp.

As described above, according to the eleventh embodiment of the present invention (FIG. 16), the power supply unit is provided with the current limiting resistor 28 (current detection unit) that is inserted between a power supply E and a P terminal (detection terminal), and the failure holding circuit determines the presence or absence of the failure of a full-wave rectifier circuit 13 based on the presence or absence of the potential difference $\Delta V\alpha\beta$ (detected current value) from the current limiting resistor 28, as a consequence of which it is possible to detect the failure of the full-wave rectifier circuit 13 with a high degree of precision by use of a simple circuit structure.

Embodiment 12

Figure 17:
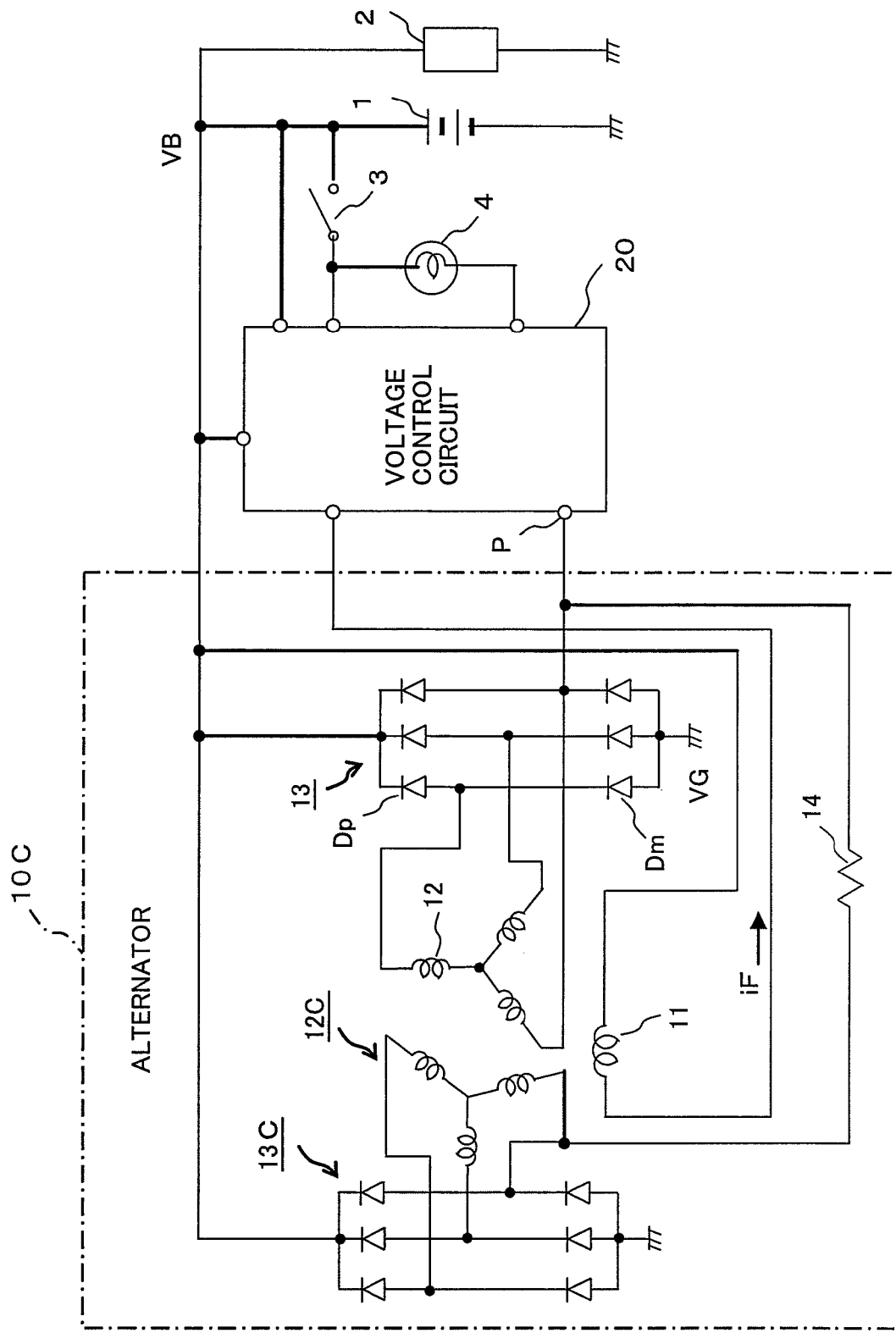
FIG. 17 is a circuit block diagram showing an alternator to which a failure detection apparatus for an alternator according to a twelfth embodiment of the present invention is applied.

Although in the above-mentioned first through eleventh embodiments (FIG. 1 through FIG. 16), the alternator 10 having a single three-phase armature coil 12 is diagnosed, an alternator having a plurality of three-phase armature coils may be diagnosed, as shown in FIG. 17.

FIG. 17 is a functional block diagram that shows a failure detection circuit for an alternator according to a twelfth embodiment of the present invention, wherein the same or like parts or elements as those described above are identified by the same symbols while omitting a detailed description thereof.

In FIG. 17, a voltage control circuit 20 including a failure detection circuit may have any of the constructions of the above-mentioned embodiments.

In this case, a stator of an alternator 10C is provided with a second armature coil 12C that is arranged in parallel to a first armature coil 12, and a second full-wave rectifier circuit 13C of the same construction as that of a first full-wave rectifier circuit 13 is connected to the second armature coil 12C.

In addition, a P terminal of at least one phase or a neutral point of the second armature coil 12C is connected to a P terminal of at least one phase or a neutral point (detection terminal) of the first armature coil 12 through a resistor 14 of low impedance.

With such arrangements, the junctions of all the diodes of the plurality of armature coils 12, 12C become equivalent potential states in a non-power generation state, so it is possible to detect the short circuit failure of the diodes of both of the armature coils 12, 12C by means of the failure detection circuit similar to those as stated above.

As described above, according to the twelfth embodiment of the present invention, the alternator 10C (alternating current generator) comprises a three-phase alternator, and has the second armature coil 12C different from the first armature coil 12, wherein the neutral point or P terminal of at least one phase of the second armature coil 12C is connected to the detection terminal through the resistor 14.

As a result, only by adding the one resistor 14, the failure of two sets of three-phase diodes can be detected with a high degree of precision by use of a simple circuit structure, similarly as stated above.

In addition, P terminals of three phases of one armature coil 12 and P terminals of three phases of the other armature coil 12C are electrically connected to each other through the resistor 14 of a predetermined low resistance value, as a result of which only a small current flows due to the predetermined low resistance value of the resistor 14 at the time of normal power generation, so there will be no hindrance to the power generating operation. On the other hand, at the time of diode short circuit failure, a failure detection current flows through the resistor 14, so it is possible to detect the short circuit failure of all the diodes only by the provision of the voltage control circuit 20 having the single failure detection circuit.

Here, note that in case where the diodes of the first and second full-wave rectifier circuits 13, 13C are constituted by Zener diodes, as stated above, when one of a pair of diodes of a certain phase is in an open circuit failure, the voltage of that phase exceeds the Zener voltage of the other of the paired diodes, and destroys the other diode pairing with the open failed diode to cause it into a short circuit failure, as a result of which the failure state of the full-wave rectifier circuit 13 can be detected by use of any failure detection circuit of the present invention.

While the invention has been described in terms of preferred embodiments, those skilled in the art will recognize that the invention can be practiced with modifications within the spirit and scope of the appended claims.

What is claimed is:

1. A failure detection apparatus for an alternator comprising:
   an armature coil;
   a full-wave rectifier circuit that is connected to said armature coil and has a positive side diode with its positive terminal electrically connected to a positive terminal of a battery, and a negative side diode with its negative terminal electrically connected to a ground terminal of said battery; and
   a failure detection circuit with its detection terminal connected to a P terminal or a neutral point of said armature coil;
   wherein when in a non-power generation state of said armature coil, said detection terminal is in a floating state or a high impedance state in which a voltage at said detection terminal is indefinite, said failure detection circuit determines that said full-wave rectifier circuit is normal; and
   when in the non-power generation state of said armature coil, said detection terminal is not in a floating state nor a high impedance state, said failure detection circuit determines that said full-wave rectifier circuit is in a failure.

2. The failure detection apparatus for an alternator as set forth in claim 1, wherein
   said failure detection circuit is provided with a warning unit, and drives said warning unit when it is determined that said full-wave rectifier circuit is in a failure.

3. The failure detection apparatus for an alternator as set forth in claim 1, wherein
   said failure detection circuit includes:
   a power supply unit that is connected to said detection terminal; and
   a failure holding unit that is connected to said power supply unit, determines the presence or absence of a failure, and holds a determination result.

4. The failure detection apparatus for an alternator as set forth in claim 3, wherein
   said power supply unit is provided with a first resistor or a first constant current source that is connected between said detection terminal and said ground terminal; and
   when the voltage at said detection terminal is equal to a ground voltage at said ground terminal, said failure holding unit determines that said full-wave rectifier circuit is normal; and
   when the voltage at said detection terminal is equal to or higher than a first predetermined value that is higher than said ground voltage, said failure holding unit determines that said positive side diode of said full-wave rectifier circuit is in a failure.

5. The failure detection apparatus for an alternator as set forth in claim 4, wherein
   said power supply unit includes a switch unit that switches said first resistor or said first constant current source to a connected state and an interrupted state; and
   said switch unit sets said first resistor or said first constant current source to the connected state in the non-power generation state of said armature coil.

6. The failure detection apparatus for an alternator as set forth in claim 3, wherein
   said power supply unit is provided with a second resistor or a second constant current source that is connected between said detection terminal and said positive terminal of said battery;
   when the voltage at said detection terminal is equal to a battery voltage at said positive terminal of said battery, said failure holding unit determines that said full-wave rectifier circuit is normal; and
   when the voltage at said detection terminal is equal to or lower than a second predetermined value that is lower than said battery voltage, said failure holding unit determines that said negative side diode of said full-wave rectifier circuit is in a failure.

7. The failure detection apparatus for an alternator as set forth in claim 6, wherein
   said power supply unit includes a switch unit that switches said second resistor or said second constant current source to a connected state and an interrupted state; and
   said switch unit sets said second resistor or said second constant current source to the connected state in the non-power generation state of said armature coil.

8. The failure detection apparatus for an alternator as set forth in claim 3, wherein
   said power supply unit includes a power supply that is connected to said detection terminal;

said power supply has an output impedance, and generates a predetermined voltage which is equal to or lower than a battery voltage at a positive terminal of said battery and is equal to or higher than a ground voltage at said ground terminal;

when the voltage at said detection terminal does not deviate from a range of said predetermined voltage, said failure holding unit determines that said full-wave rectifier circuit is normal;

when the voltage at said detection terminal is lower than a lower limit value of said predetermined voltage range, said failure holding unit determines that said negative side diode of said full-wave rectifier circuit is in a short circuit failure; and when the voltage at said detection terminal is higher than an upper limit value of said predetermined voltage range, said failure holding unit determines that said positive side diode of said full-wave rectifier circuit is in a failure.

9. The failure detection apparatus for an alternator as set forth in claim 8, wherein said alternator and said battery are installed on a vehicle; and said predetermined voltage is generated by dividing said battery voltage at the positive terminal of said battery by means of two resistors connected in series with each other.

10. The failure detection apparatus for an alternator as set forth in claim 8, wherein said power supply unit includes a switch unit that switches said power supply to a connected state and an interrupted state; and said switch unit sets said power supply to the connected state in the non-power generation state of said armature coil.

11. The failure detection apparatus for an alternator as set forth in claim 8, wherein said power supply unit includes a current detection unit that is inserted between said power supply and said detection terminal; and said failure holding unit determines the presence or absence of a failure of said full-wave rectifier circuit based on the presence or absence of a detected current value of said current detection unit.

12. The failure detection apparatus for an alternator as set forth in claim 11, wherein said predetermined voltage is set to said battery voltage or said ground voltage.

13. A failure detection apparatus for an alternator as set forth in claim 1, wherein said alternator comprises a three-phase alternator, and includes a first armature coil and a second armature coil that is different from said first armature coil; and said second armature coil has a neutral point or a P terminal of at least one phase connected to said detection terminal through a resistor.

14. A failure detection apparatus for an alternator as set forth in claim 1, wherein each of said positive side diode and said negative side diode of said full-wave rectifier circuit is composed of a Zener diode.

* * * * *